(12) United States Patent
Bae et al.

(10) Patent No.: US 11,984,537 B2
(45) Date of Patent: May 14, 2024

(54) DISPLAY DEVICE

(71) Applicant: Samsung Display Co., Ltd., Yongin-si (KR)

(72) Inventors: Su Bin Bae, Yongin-si (KR); Yun Jong Yeo, Yongin-si (KR); Jung Yun Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/188,783

(22) Filed: Mar. 1, 2021

(65) Prior Publication Data

US 2021/0399177 A1 Dec. 23, 2021

(30) Foreign Application Priority Data

Jun. 22, 2020 (KR) ........................ 10-2020-0075997

(51) Int. Cl.
| | |
|---|---|
| *H01L 33/38* | (2010.01) |
| *H01L 33/40* | (2010.01) |
| *H01L 33/42* | (2010.01) |
| *H01L 33/50* | (2010.01) |
| *H01L 33/62* | (2010.01) |

(52) U.S. Cl.
CPC .......... *H01L 33/387* (2013.01); *H01L 33/405* (2013.01); *H01L 33/42* (2013.01); *H01L 33/502* (2013.01); *H01L 33/62* (2013.01)

(58) Field of Classification Search
CPC ... H01L 33/62; H01L 25/0753; H01L 33/387; H01L 33/405; H01L 33/42; H01L 25/167; H01L 33/385; H01L 33/502
See application file for complete search history.

(56) References Cited

U.S. PATENT DOCUMENTS

| | | | |
|---|---|---|---|
| 10,373,985 B2 | 8/2019 | Kim et al. | |
| 2015/0362165 A1* | 12/2015 | Chu | H01L 27/156 362/235 |
| 2018/0175009 A1* | 6/2018 | Kim | H01L 25/0753 |
| 2018/0175106 A1* | 6/2018 | Kim | H01L 25/167 |
| 2019/0115513 A1* | 4/2019 | Im | H01L 33/06 |
| 2019/0214376 A1 | 7/2019 | Kim | |
| 2019/0305035 A1* | 10/2019 | Cho | H01L 33/46 |
| 2021/0242380 A1* | 8/2021 | Kim | H01L 25/0753 |

(Continued)

FOREIGN PATENT DOCUMENTS

| | | |
|---|---|---|
| EP | 3 316 302 A1 | 5/2018 |
| EP | 3 823 028 A1 | 5/2021 |

(Continued)

*Primary Examiner* — Latanya N Crawford Eason
(74) *Attorney, Agent, or Firm* — Lewis Roca Rothgerber Christie LLP

(57) ABSTRACT

A display device includes a substrate; a first circuit part and a second circuit part on the substrate and spaced from each other in a first direction; and an emission part between the first circuit part and the second circuit part, the emission part being located between the first circuit part and the second circuit part in a direction parallel to the substrate, wherein the first circuit part includes a first electrode extending to the emission part, wherein the second circuit part includes a second electrode extending to the emission part, and wherein the emission part includes a light emitting element located between the first electrode and the second electrode.

14 Claims, 15 Drawing Sheets

(56) References Cited

U.S. PATENT DOCUMENTS

| | | |
|---|---|---|
| 2021/0288033 A1 | 9/2021 | Lim et al. |
| 2021/0288217 A1* | 9/2021 | Li .......................... H01L 25/167 |
| 2021/0351171 A1 | 11/2021 | Yoo et al. |

FOREIGN PATENT DOCUMENTS

| | | |
|---|---|---|
| KR | 10-2019-0085197 A | 7/2019 |
| WO | WO 2020/013386 A1 | 1/2020 |
| WO | WO 2020/059989 A1 | 3/2020 |

\* cited by examiner

DISPLAY DEVICE

CROSS-REFERENCE TO RELATED APPLICATION

This application claims priority to and the benefit of Korean patent application No. 10-2020-0075997 filed on Jun. 22, 2020, the entire disclosure of which is incorporated herein in its entirety by reference.

BACKGROUND

1. Field

Various embodiments of the present disclosure relates to a display device.

2. Description of Related Art

With an increase in interest in an information display and an increase in demand to use portable information media, demand for display devices has markedly been increased, and commercialization thereof has been in progress.

SUMMARY

Various embodiments of the present disclosure are directed to a display device capable of simplifying a process of manufacturing the display device and reducing the manufacturing cost thereof.

The aspects of the present disclosure are not limited to the above-stated features, and those skilled in the art will clearly understand other not mentioned aspects from the accompanying claims.

One or more example embodiments of the present disclosure may include a display device including a substrate, a first circuit part and a second circuit part on the substrate and spaced from each other in a first direction, and an emission part between the first circuit part and the second circuit part, the emission part being located between the first circuit part and the second circuit part in a direction parallel to the substrate. The first circuit part may include a first electrode extending to the emission part. The second circuit part may include a second electrode extending to the emission part. The emission part may include a light emitting element between the first electrode and the second electrode.

In some embodiments, the display device may further include a first insulating layer, wherein at least a portion of the first insulating layer is on the first electrode and at least another portion of the first insulating layer is on the second electrode. The first insulating layer may be between the substrate and the light emitting element.

In some embodiments, the first circuit part may include a third electrode on and in contact with the first electrode and a first end of the light emitting element. The second circuit part may include a fourth electrode on and in contact with the second electrode and a second end of the light emitting element.

In some embodiments, the first insulating layer may include a first opening and a second opening, wherein a portion of the first electrode is exposed through the first opening, and a portion of the second electrode is exposed through the second opening. The third electrode may contact with the first electrode through the first opening. The fourth electrode may contact with the second electrode through the second opening.

In some embodiments, the display device may include a second insulating layer, wherein at least a portion of the second insulating layer is on the third electrode and at least another portion of the second insulating layer is on the light emitting element. The fourth electrode may be on the second insulating layer.

In some embodiments, the third electrode and the fourth electrode may be concurrently formed at a same layer.

In some embodiments, each of the third electrode and the fourth electrode may include a transparent conductive oxide.

In some embodiments, the display device may further include a fixing layer enclosing at least a portion of an outer peripheral surface of the light emitting element and exposing the first end and the second end of the light emitting element. The fixing layer may be located between the light emitting element and the third electrode.

In some embodiments, the first circuit part may include a driving transistor between the substrate and the first electrode and electrically coupled with the light emitting element. The driving transistor may include an active layer on the substrate, a gate electrode on the active layer, and a first transistor electrode and a second transistor electrode located above the gate electrode and in contact with the active layer.

In some embodiments, the display device may further include a third transistor electrode on the first transistor electrode and electrically coupled with the first transistor electrode through a contact hole. The first electrode may be integrally formed with the third transistor electrode.

In some embodiments, the display device may further include a third transistor electrode on the first transistor electrode and electrically coupled with the first transistor electrode through a contact hole. The first electrode may be integrally formed with the first transistor electrode.

In some embodiments, the driving transistor may further include a bottom electrode layer between the substrate and the active layer.

In some embodiments, the first insulating layer may contact with the substrate and the light emitting element.

In some embodiments, each of the first electrode and the second electrode may include a metal having a suitable reflectivity.

In some embodiments, the display device may further include a wavelength conversion layer on the light emitting element. The wavelength conversion layer may include a wavelength conversion particle and a scattering particle. The wavelength conversion particle may include a quantum dot.

One or more example embodiments of the present disclosure may include a display device including a substrate, a first electrode and a second electrode on the substrate, the first electrode and the second electrode being at a same layer and spaced from each other, a first insulating layer on the first electrode and the second electrode, a light emitting element on the first insulating layer and located between the first electrode and the second electrode, and a driving transistor located between the substrate and the first electrode and electrically coupled with the light emitting element. The first insulating layer may be between the substrate and the light emitting element and in contact with the substrate exposed between the first electrode and the second electrode.

In some embodiments, the display device may further include a third electrode electrically coupling the first electrode and a first end of the light emitting element, and a fourth electrode electrically coupling the second electrode with a second end of the light emitting element.

In some embodiments, the first insulating layer may include a first opening and a second opening, wherein a portion of the first electrode is exposed through the first opening, a portion of the second electrode is exposed through the second opening. The third electrode may contact with the first electrode through the first opening. The fourth electrode may contact with the second electrode through the second opening.

In some embodiments, the third electrode and the fourth electrode may be concurrently formed at a same layer.

In some embodiments, the display device may further include a second insulating layer on the third electrode. The fourth electrode may be on the second insulating layer.

Details of various embodiments are included in the detailed descriptions and drawings.

DETAILED DESCRIPTION

Figure 1:
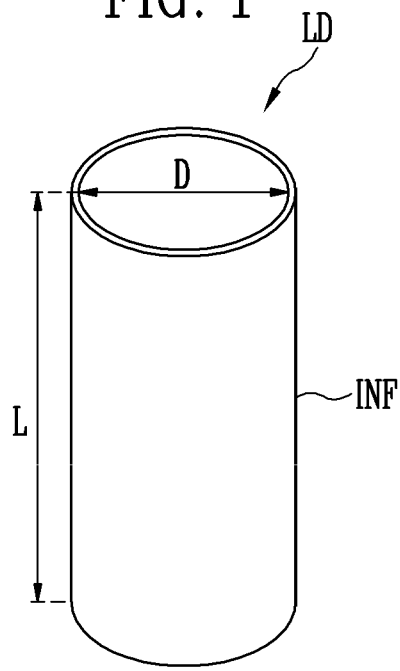
FIGS. 1 and 2 are a perspective view and a sectional view illustrating a light emitting element in accordance with one or more example embodiments of the present disclosure.

Aspects and features of the present disclosure, and methods for achieving the same will become apparent to those having ordinary skill in the art with reference to embodiments described later in detail together with the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims and their equivalents.

It will be understood that when an element or a layer is referred to as being "on" another element or a layer, it can be directly on, connected to, or coupled to the other element or the layer, or one or more intervening elements or layers may be present. The shapes, sizes, ratios, angles, numbers, etc. of components given in the drawings to describe embodiments are only for illustrative purposes, and the present disclosure is not limited to those shown in the drawings. Like reference numerals refer to like elements throughout. Furthermore, in the drawings, expression of components unrelated to the present disclosure may be omitted or simplified to make the description of the present disclosure clear.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. In the present disclosure, the singular forms are intended to include the plural forms as well, unless the context clearly indicates otherwise.

The features of various embodiments of the present disclosure can be partially or entirely coupled or combined with each other and can be interlocked and operated in technically various ways. The embodiments can be carried out independently of or in association with each other.

Hereinafter, embodiments of the present disclosure will be described in detail with reference to the accompanying drawings.

Figure 2:
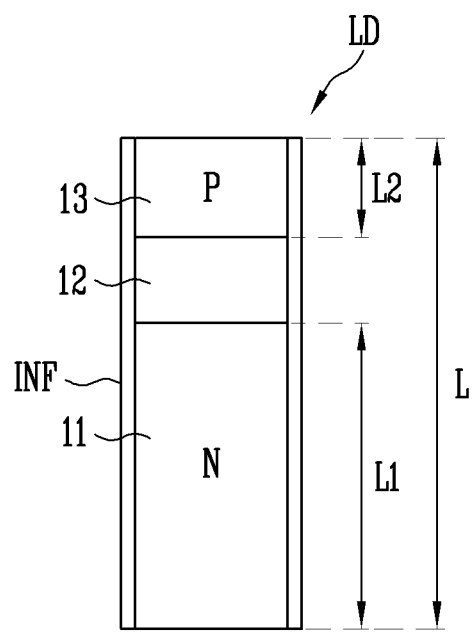

FIGS. 1 and 2 are a perspective view and a sectional view illustrating a light emitting element in accordance with one or more example embodiments of the present disclosure. Although a rod-type light emitting element LD of a cylindrical shape is illustrated in FIGS. 1 and 2, the type and/or shape of the light emitting element LD according to the present disclosure are not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be configured of a stacked body formed by successively stacking the first semiconductor layer 11, the active layer 12, and the second semiconductor layer 13 in one direction.

In some embodiments, the light emitting diode LD may be a rod-type light emitting diode manufactured in the form of a rod. Here, the term "rod-like shape" embraces a rod-like shape and a bar-like shape such as a cylindrical shape and a prismatic shape that is longer in a longitudinal direction than in a width direction, and the cross-sectional shape thereof is not limited to a particular shape. For example, the length L of the light emitting element LD may be greater than a diameter D of the light emitting element LD (or a width of the cross-section thereof). In other words, the aspect ratio of the light emitting element LD may be greater than 1.

The light emitting element LD may include a first end and a second end that are opposite each other in one direction. The first end and the second end of the light emitting element LD may be surfaces to be exposed to the outside. For example, the second semiconductor layer 13 may be disposed on the first end of the light emitting element LD, and the first semiconductor layer 11 may be disposed on the second end of the light emitting element LD, and vice-versa.

In some embodiments, the light emitting element LD may have a small size corresponding to the nano-scale or the micro-scale, e.g., a diameter D and/or a length L ranging from 100 nm to 10 μm. However, the size of the light emitting element LD is not limited to this. For example, the size of the light emitting element LD may be changed in various ways depending on design conditions of various devices, e.g., a display device, which employs, as a light source, a light emitting device using a light emitting element LD.

The first semiconductor layer 11 may include at least one n-type semiconductor material. For instance, the first semiconductor layer 11 may include an n-type semiconductor material which includes any one semiconductor material from among InAlGaN, GaN, AlGaN, InGaN, AlN, and InN, and is doped with a first conductive dopant such as Si, Ge, or Sn. However, the material for forming the first semiconductor layer 11 is not limited to this, and the first semiconductor layer 11 may be formed of various other materials.

The active layer 12 may be formed on the first semiconductor layer 11 and have a single or multiple quantum well structure. In the case where the active layer 12 includes material having a multiple quantum well structure, the active layer 12 may have a structure formed by alternately stacking a plurality of quantum layers and a plurality of well layers.

If an electric field having a voltage (e.g., a predetermined voltage) or more is applied between the opposite ends of the light emitting element LD, the light emitting element LD emits light by coupling of electron-hole pairs in the active layer 12. Because light emission of the light emitting element LD can be controlled based on the foregoing principle, the light emitting element LD may be used as a light source of various light emitting devices as well as a pixel of the display device.

The active layer 12 may emit light having a wavelength ranging from 400 nm to 900 nm. For example, in the case where the active layer 12 emits light in a blue or green wavelength range, the active layer 12 may include inorganic material including nitrogen, e.g., ALGaN, or ALGaInN. In the case where the active layer 12 has a structure formed by alternately stacking quantum layers and well layers as a multiple quantum well structure, the quantum layers may include inorganic material such as AlGaN or AlGaInN, and the well layers may include inorganic material such as GaN or AlInN. In some embodiments, the active layer 12 may include AlGaInN as a quantum layer and AlInN as a well layer.

However, the material and structure of the light emitting element LD are not limited thereto. The active layer 12 may have a structure formed by alternately stacking semiconductor materials having high band-gap energy and semiconductor materials having low band-gap energy. Furthermore, the active layer 12 may include Group III to V semiconductor materials depending on the wavelength range of emitted light. Light emitted from the active layer 12 is not limited to light having a blue or green wavelength range, and may be light having a red wavelength range depending on material included therein.

Light emitted from the active layer 12 may be emitted to the first end and the second end of the light emitting element LD in the longitudinal direction of the light emitting element LD. Furthermore, some light emitted from the active layer 12 may be emitted to a side surface (or an outer circumferential surface) of the active layer 12. In other words, the directionality of light emitted from the active layer 12 is not limited to any one direction.

The second semiconductor layer 13 may be disposed on the active layer 12 and include a semiconductor material having a type different from that of the first semiconductor layer 11. For example, the second semiconductor layer 13 may include at least one p-type semiconductor material. For instance, the second semiconductor layer 13 may include a p-type semiconductor material which includes any one semiconductor material from among InAlGaN, GaN, AlGaN, InGaN, AlN, and InN, and is doped with a second conductive dopant such as Mg, Zn, Ca, Se, or Ba. However, the material for forming the second semiconductor layer 13 is not limited to this, and the second semiconductor layer 13 may be formed of various other materials.

Although in the drawing the first semiconductor layer 11 and the second semiconductor layer 13 each is formed of a single layer, the present disclosure is not limited thereto. For example, the number of layers included in each of the first semiconductor layer 11 and the second semiconductor layer 13 may be increased depending on the material of the active layer 12. For example, the first semiconductor layer 11 and the second semiconductor layer 13 may further include a clad layer or a tensile strain barrier reducing layer (TSBR) layer.

In some embodiments, a first length L1 of the first semiconductor layer 11 may be greater than a second length L2 of the second semiconductor layer 13.

In some embodiments, the light emitting element LD may further include an insulating film INF provided on a surface of the light emitting element LD. The insulating film INF may be formed on the surface of the light emitting element LD to enclose an outer peripheral surface (e.g., an outer circumferential surface) of the active layer 12 and also enclose the first semiconductor layer 11 and the second semiconductor layer 13.

In some embodiments, the insulating film INF may allow the first end and the second end of the light emitting element LD to be exposed. For example, the insulating film INF may expose one end of each of the first semiconductor layer 11 and the second semiconductor layer 13 that are disposed on the opposite ends of the light emitting element LD with respect to the longitudinal direction. In other words, the insulating film INF may expose two surfaces (i.e. top and bottom surfaces) of the cylinder rather than covering them.

In some embodiments, the insulating film INF may include transparent insulating material. For example, the insulating film INF may include at least one or more inorganic insulating materials from among $SiO_2$, $Si_3N_4$, $Al_2O_3$, and $TiO_2$, but the material for forming the insulating film INF is not particularly limited thereto. The insulating film INF may be formed of various well-known insulating materials.

The insulating film INF may prevent the active layer 12 from short-circuiting due to making contact with a conductive material except the first semiconductor layer 11 and the second semiconductor layer 13. Furthermore, because of the insulating film INF, occurrence of a defect on the surface of the light emitting element LD may be reduced or minimized, whereby the lifetime and efficiency of the light emitting element LD may be improved. In the case where a plurality of light emitting elements LD are disposed in close contact with each other, the insulating film INF may prevent an undesired short-circuit from occurring between the light emitting elements LD.

In some embodiments, the light emitting element LD may include not only the first semiconductor layer 11, the active layer 12, the second semiconductor layer 13, and/or the insulating film INF but also other additional components disposed over and/or under each layer. For example, the light emitting element LD may further include at least one fluorescent layer, at least one active layer, at least one semiconductor material layer and/or at least one electrode layer disposed on at least one end of the first semiconductor layer 11, the active layer 12, and/or the second semiconductor layer 13.

Figure 3:
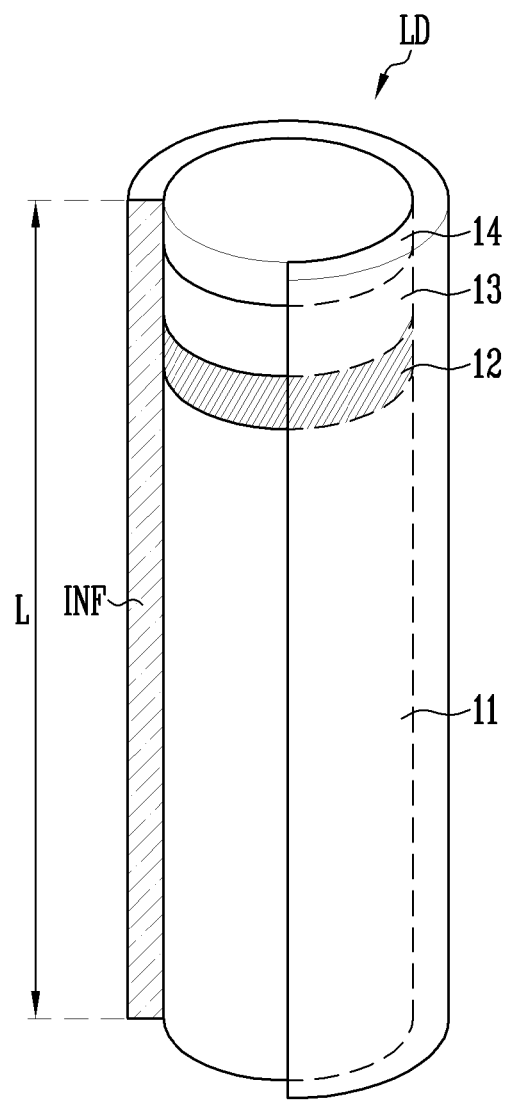
FIG. 3 is a perspective cutaway view illustrating a light emitting element in accordance with one or more example embodiments of the present disclosure.

FIG. 3 is a perspective cutaway view illustrating a light emitting element in accordance with one or more example embodiments of the present disclosure. For the sake of explanation, FIG. 3 shows the insulating film INF a portion of which has been removed.

Referring to FIG. 3 along with FIGS. 1 and 2, the light emitting element LD may further include an electrode layer 14 disposed on the second semiconductor layer 13.

The electrode layer 14 may be an ohmic contact electrode electrically coupled to the second semiconductor layer 13, but the present disclosure is not limited thereto. In some embodiments, the electrode layer 14 may be a Schottky contact electrode. The electrode layer 14 may include metal or metal oxide. For example, the electrode layer 14 may include Cr, Ti, Al, Au, Ni, indium tin oxide (ITO), indium zinc oxide (IZO), indium tin zinc oxide (ITZO), etc.

In some embodiments, the electrode layer 14 may be substantially transparent or translucent. Thereby, light generated from the active layer 12 of the light emitting element LD may be emitted to the outside after passing through the electrode layer 14.

Figure 4:
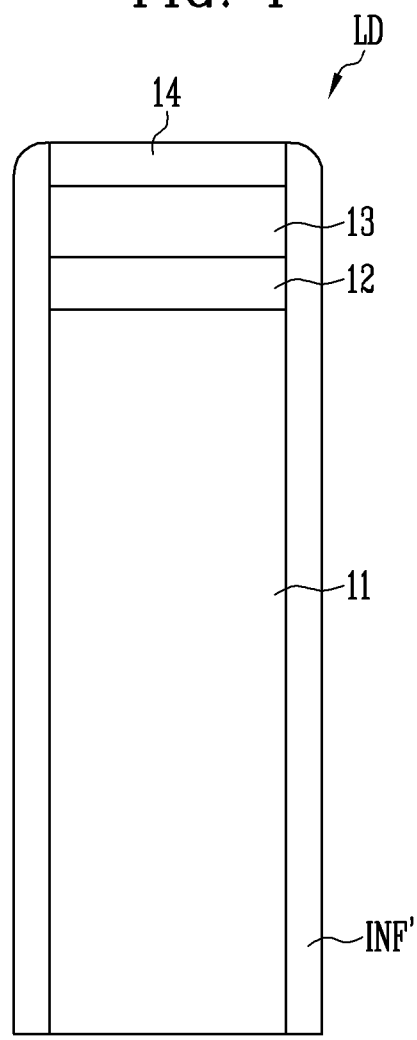
FIG. 4 is a sectional view illustrating a light emitting element in accordance with one or more example embodiments of the present disclosure.

FIG. 4 is a sectional view illustrating a light emitting element in accordance with one or more example embodiments of the present disclosure.

Referring to FIG. 4 along with FIG. 3, an insulating film INF' may have at least partially curved shape on a corner area thereof adjacent to the electrode layer 14. In some embodiments, the curved shape may be formed through an etching process when the light emitting element LD is manufactured.

In the case where the electrode layer 14 is not included in the same manner as that of the light emitting element LD illustrated in FIGS. 1 and 2, the insulating film INF' may also have an at least partially curved shape on a corner area thereof.

Figure 5:
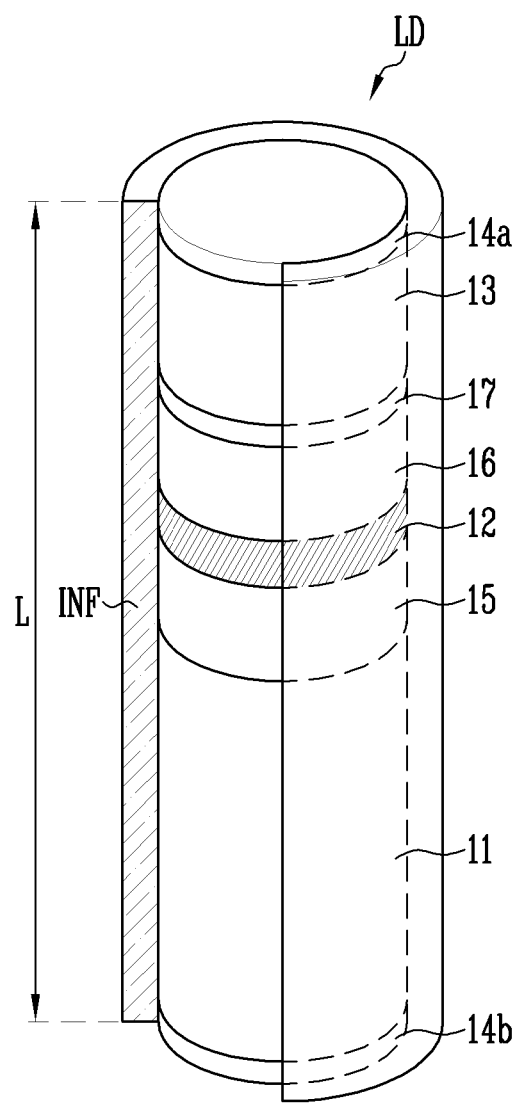
FIG. 5 is a perspective cutaway view illustrating a light emitting element in accordance with one or more example embodiments of the present disclosure.

FIG. 5 is a perspective cutaway view illustrating a light emitting element in accordance with one or more example embodiments of the present disclosure. For example, FIG. 5 shows the insulating film INF, a portion of which has been removed.

Referring to FIG. 5 along with FIGS. 1 and 2, the light emitting element LD may further include a third semiconductor layer 15 disposed between the first semiconductor layer 11 and the active layer 12, and a fourth semiconductor layer 16 and a fifth semiconductor layer 17 which are disposed between the active layer 12 and the second semiconductor layer 13. Furthermore, the light emitting element LD may further include a first electrode layer 14a formed on an upper surface of the second semiconductor layer 13, and a second electrode layer 14b formed on a lower surface of the first semiconductor layer 11.

The light emitting element LD of FIG. 5 differs from the embodiment of FIG. 1 in that the plurality of semiconductor layers 15, 16, and 17 and the electrode layers 14a and 14b are further disposed, and the active layer 12 contains other elements. Other than the differences, the disposition and structure of the insulating film INF are substantially the same as that of FIG. 1.

As described above, in the light emitting element LD of FIG. 1, the active layer 12 may include nitrogen (N) and emit blue or green light. In the light emitting element LD of FIG. 5, the active layer 12 and other semiconductor layers 11, 13, 15, 16, and 17 each include a semiconductor including phosphorus (P). In other words, the light emitting element LD in accordance with the embodiment of FIG. 5 may emit red light having a center wavelength band ranging from 620 nm to 750 nm. However, the center wavelength band of the red light is not limited to the above-mentioned range, and it should be interpreted that the center wavelength band includes all wavelength ranges that can be recognized as being red in the technical field of the present disclosure.

In detail, in the light emitting element LD in accordance with the embodiment of FIG. 5, the first semiconductor layer 11 may include an n-type semiconductor material. For instance, the first semiconductor layer 11 may include an n-type semiconductor material which includes any one semiconductor material from among InAlGaP, GaP, AlGaP, InGaP, AlP, and InP, and is doped with a first conductive dopant such as Si, Ge, or Sn. In some embodiments, the first semiconductor layer 11 may be n-AlGaInP doped with n-type Si.

The second semiconductor layer 13 may include p-type semiconductor material. For instance, the second semiconductor layer 13 may include a p-type semiconductor material which includes any one semiconductor material from among InAlGaP, GaP, AlGaNP, InGaP, AlP, and InP, and is doped with a second conductive dopant such as Mg, Zn, Ca, Se, or Ba. In some embodiments, the second semiconductor layer 13 may be p-GaP doped with p-type Mg.

The active layer 12 may be disposed between the first semiconductor layer 11 and the second semiconductor layer 13. The active layer 12 of FIG. 5 may include material having a single or multiple quantum well structure and emit light in a specific wavelength range, in the same manner as that of the active layer 12 of FIG. 1. For example, the active layer 12 may include material such as AlGaP, and AlInGaP. For example, in the case where the active layer 12 has a structure formed by alternately stacking quantum layers and well layers as a multiple quantum well structure, the quantum layers may include inorganic material such as AlGaP or AlInGaP, and the well layers may include material such as GaP or AlInP. In some embodiments, the active layer 12 may include AlGaInP as a quantum layer and AlInP as a well layer, and emit red light having a center wavelength band ranging from 620 nm to 750 nm.

The light emitting element LD of FIG. 5 may include a clad layer disposed adjacent to the active layer 12. For example, the third semiconductor layer 15 and the fourth semiconductor layer 16 that are respectively disposed under and over the active layer 12 between the first semiconductor layer 11 and the second semiconductor layer 13 may be clad layers.

The third semiconductor layer 15 may be disposed between the first semiconductor layer 11 and the active layer 12. The third semiconductor layer 15 may include an n-type semiconductor material in the same manner as that of the first semiconductor layer 11. In some embodiments, the third semiconductor layer 15 may be n-AlInP, but the present disclosure is not limited thereto.

The fourth semiconductor layer 16 may be disposed between the active layer 12 and the second semiconductor layer 13. The fourth semiconductor layer 16 may include a p-type semiconductor material in the same manner as that of the second semiconductor layer 13. In some embodiments, the fourth semiconductor layer 16 may be p-AlInP.

The fifth semiconductor layer 17 may be disposed between the fourth semiconductor layer 16 and the second semiconductor layer 13. The fifth semiconductor layer 17 may include a p-type semiconductor material in the same manner as that of the second semiconductor layer 13 and the fourth semiconductor layer 16. In some embodiments, the fifth semiconductor layer 17 may function to reduce a difference in lattice constant between the fourth semiconductor layer 16 and the second semiconductor layer 13. For example, the fifth semiconductor layer 17 may be a tensile strain barrier reducing (TSBR) layer. In some embodiments, the fifth semiconductor layer 17 may include p-GaInP, p-AlInP, p-AlGaInP, etc., but the present disclosure is not limited thereto.

The first electrode layer 14a and the second electrode layer 14b may be respectively disposed on the second semiconductor layer 13 and the first semiconductor layer 11. The first electrode layer 14a may be disposed on an upper surface of the second semiconductor layer 13, and the second electrode layer 14b may be disposed under a lower surface of the first semiconductor layer 11. In some embodiments, at least one of the first electrode layer 14a and the second electrode layer 14b may be omitted. The first electrode layer 14a and the second electrode layer 14b each may include at least one of the materials listed as examples for the electrode layer 14 in FIG. 3.

Figure 6:
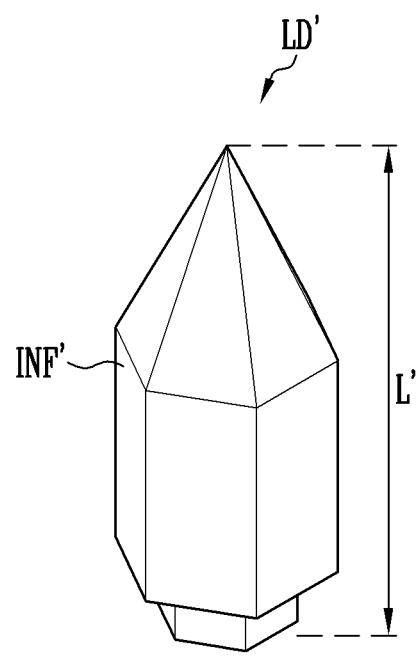
FIGS. 6 and 7 are perspective view and a sectional view illustrating a light emitting element in accordance with one or more example embodiments of the present disclosure.
Figure 7:
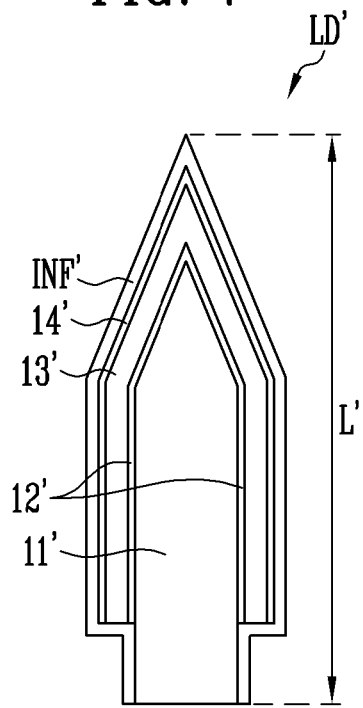

FIGS. 6 and 7 are perspective view and sectional view illustrating a light emitting element in accordance with one or more example embodiments of the present disclosure. For example, FIGS. 6 and 7 show an insulating film INF, a portion of which has been removed.

Referring to FIGS. 6 and 7, a light emitting element LD' in accordance with some embodiments includes a first semiconductor layer 11', a second semiconductor layer 13', and an active layer 12' interposed between the first and second semiconductor layers 11' and 13'. In some embodiments, the first semiconductor layer 11' may be disposed in a central area of the light emitting element LD', and the active layer 12' may be disposed on a surface of the first semiconductor layer 11' to enclose at least one area of the first semiconductor layer 11' along the edge or periphery of the first semiconductor layer 11'. The second semiconductor layer 13' may be disposed on a surface of the active layer 12' to enclose at least one area of the active layer 12' along the edge or periphery of the active layer 12'.

The light emitting element LD' may further include an electrode layer 14' and/or an insulating film INF' configured to enclose at least one area of the second semiconductor layer 13' along the edge or periphery of the second semiconductor layer 13'. For example, the light emitting element LD' may further include the electrode layer 14' disposed on a surface of the second semiconductor layer 13' to enclose one area of the second semiconductor layer 13', and the insulating film INF' disposed on a surface of the electrode layer 14' to enclose at least one area of the electrode layer 14' along the edge or periphery of the electrode layer 11'. In other words, the light emitting element LD' in accordance with the above-mentioned embodiment may be implemented as a core-shell structure including the first semiconductor layer 11', the active layer 12', the second semiconductor layer 13', the electrode layer 14', and the insulating film INF' that are successively disposed in a direction from the center to the periphery of the light emitting element LD' in an outward direction. In some embodiments, the electrode layer 14' and/or the insulating film INF' may be omitted.

In some embodiments, the light emitting element LD' may be provided in the form of a faceted cone extending in one direction (e.g., a longitudinal direction L'). For example, the light emitting element LD' may have a hexagonal pyramid shape. However, the shape of the light emitting element LD' is not limited to the foregoing shape, and may be changed in various ways.

In some embodiments, opposite ends of the first semiconductor layer 11' may have shapes protruding in the longitudinal direction L' of the light emitting element LD'. The shapes of the opposite ends of the first semiconductor layer 11' may differ from each other. For example, disposed at an upper position, one end of the opposite ends of the first semiconductor layer 11' may have a horn shape the width of which is reduced upward to form one apex. Furthermore, disposed at a lower position, the other end of the opposite ends of the first semiconductor layer 11' may have a polyprism shape having a width (e.g., a predetermined width).

In some embodiments, the first semiconductor layer 11' may be disposed in a core of the light emitting element LD', i.e., a central (or middle) portion of the light emitting element LD'. Furthermore, the light emitting element LD' may have a shape corresponding to the shape of the first semiconductor layer 11'. For instance, if the first semiconductor layer 11' has a hexagonal pyramid shape, the light emitting element LD' may have a hexagonal pyramid shape.

In the following example embodiments, there will be illustrated examples in which the light emitting element LD shown in FIGS. 1 and 2 is used. Those skilled in the art would understand that various types of light emitting elements including the light emitting element LD/LD' shown in FIGS. 3-7 can be applied to the example embodiments.

Figure 8:
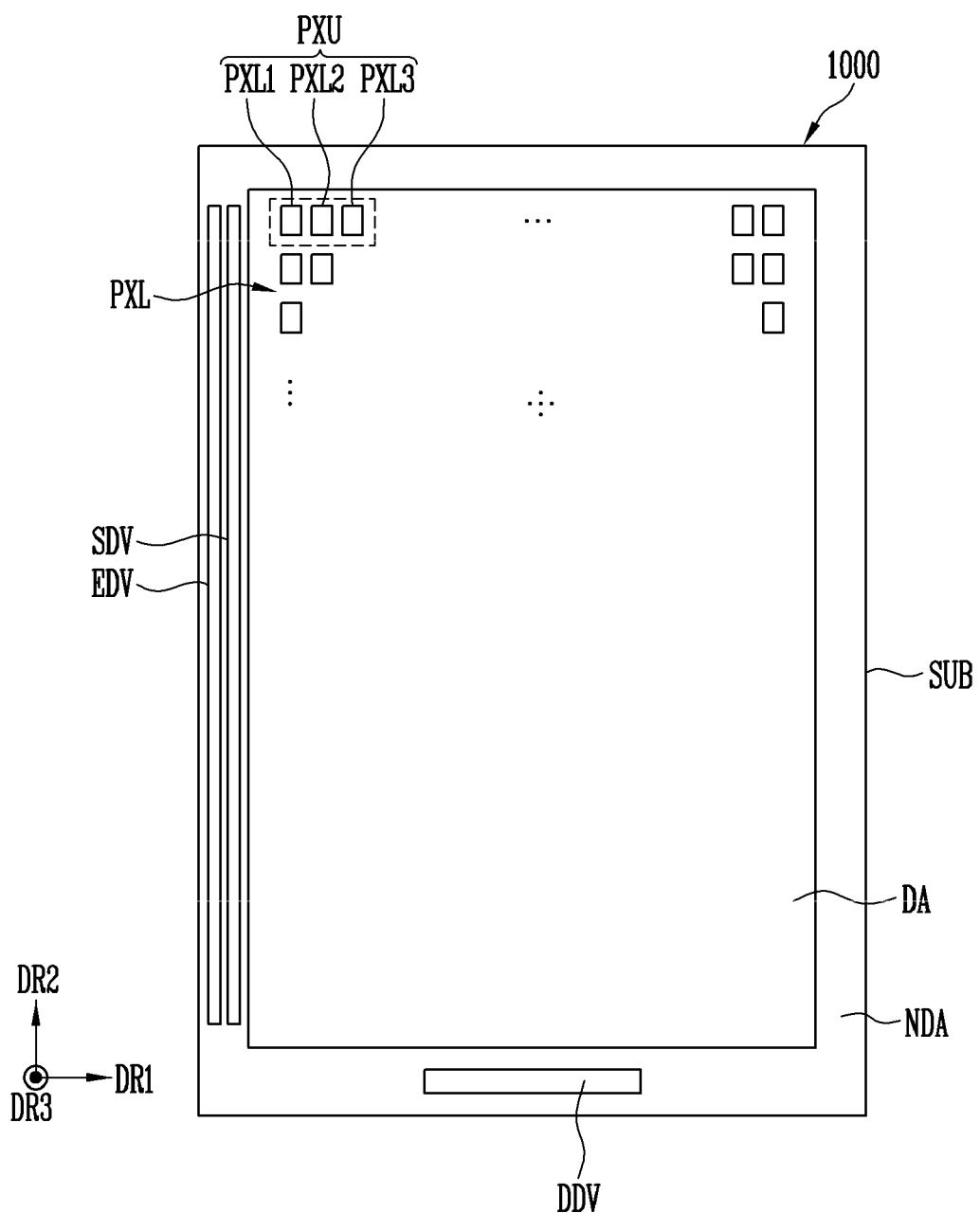
FIG. 8 is a plan view schematically illustrating a display device in accordance with one or more example embodiments of the present disclosure.

FIG. 8 is a plan view schematically illustrating a display device in accordance with some embodiments of the present disclosure.

Referring to FIGS. 1, 2, and 8, the display device 1000 may include a substrate SUB, and a plurality of pixels PXL provided on the substrate SUB. The substrate SUB may include a display area DA on which the plurality of pixels PXL are formed to display an image, and a non-display area NDA that is other area of the substrate SUB from the display area DA. The non-display area NDA may surround the display area DA along the edge or periphery of the display area DA.

The substrate SUB may be formed of glass, quartz, ceramic, plastic, etc. In the case where the substrate SUB includes plastic, the substrate SUB may be formed of a flexible substrate, but the present disclosure is not limited thereto. For example, the substrate SUB may include organic material such as polyimide (PI).

The display area DA may be an area in which the pixels PXL are provided. The non-display area NDA may be an area in which drivers SDV (e.g., a scan driver), DDV (e.g., a data driver), and EDV (e.g., an emission control driver), and various lines for connecting and the pixels PXL with the drivers SDV, DDV, and EDV are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

In the case where the display area DA includes a plurality of areas, each area may also have various shapes, as described above. The surface areas of the plurality of areas may be the same as or different from each other. In some embodiments of the present disclosure, there will be described an example in which the display area DA is provided with a single area having a rectangular shape (or substantially rectangular shape) including linear sides.

The non-display area NDA may be provided on at least one side of the display area DA. In some embodiments, the non-display area NDA may enclose the display area DA.

The pixels PXL may be disposed in the display area DA on the substrate SUB. Each of the pixels PXL may include at least one light emitting element LD coupled with a scan line and a data line and configured to be driven in response to a corresponding scan signal and a corresponding data signal.

Each of the pixels PXL may emit light having any one color from among red, green, and blue, and it is not limited thereto. For example, each of the pixels PXL may emit light having any one color from among cyan, magenta, yellow, and white.

In some embodiments, the pixels PXL may include a first pixel PXL1 (or a first sub-pixel) configured to emit light having a first color, a second pixel PXL2 (or a second sub-pixel) configured to emit light having a second color different from the first color, and a third pixel PXL3 (or a third sub-pixel) configured to emit light having a third color different from the first color or the second color. The first pixel PXL1, the second pixel PXL2, and the third pixel PXL3 that are disposed adjacent to each other may form one pixel unit PXU which may emit light having various colors.

In some embodiments, the first pixel PXL1 may be a red pixel that emits red light, a second pixel PXL2 may be a green pixel that emits green light, and a third pixel PXL3 may be a blue pixel that emits blue light.

In some embodiments, the respective pixels PXL may be provided with light emitting elements LD configured to emit light having the same color, and include different color conversion layers disposed on the respective light emitting elements LD so that different colors of light may be emitted. In some embodiments, the respective pixels PXL may include light emitting elements LD configured to emit different colors of light.

The pixels PXL may be arranged in a first direction DR1 and a second direction DR2 crossing the first direction DR1. However, the arrangement of the pixels PXL is not particularly limited, and may be arranged in various forms.

The drivers SDV, DDV, and EDV may provide signals to the pixels PXL through the respective lines (not illustrated) and thus control the operation of the pixels PXL. In FIG. 8, the lines are omitted for the convenience of explanation.

The drivers SDV, DDV, and EDV may include a scan driver SDV configured to provide a scan signal to the pixels PXL through a scan line, a data driver DDV configured to provide a data signal to the pixels PXL through a data line, an emission control driver EDV configured to provide an emission control signal to the pixels PXL through an emission control line, and a timing controller (not illustrated). The timing controller may control the scan driver SDV, the data driver DDV, and the emission control driver EDV.

In some embodiments, the emission control driver EDV may be omitted. Furthermore, in some embodiments, the timing controller may be integrated with the date driver DDV and provided as a single configuration.

The scan driver SDV may be disposed on one side of the substrate SUB and arranged along one direction (e.g., the second direction DR2). The scan driver SDV may be mounted on the substrate SUB as a separate component, but the present disclosure is not limited thereto. For example, the scan driver SDV may be directly formed on the substrate SUB. Furthermore, the scan driver SDV may be located outside the substrate SUB and coupled to the pixels PXL through connectors.

The data driver DDV may be disposed on one side of the substrate SUB and may extend in a direction (e.g., in the first direction DR1) crossing a direction (e.g., a second direction DR2) in which the scan driver SDV extends. Furthermore, the data driver DDV may be disposed on the substrate SUB as a separate component, or may be located outside the substrate SUB and coupled to the pixels PXL through connectors.

The emission control driver EDV may be disposed on one side of the substrate SUB and may extend in a direction (e.g., in the second direction DR2) that is the same direction (e.g., the second direction DR2) in which the scan driver SDV extends. As illustrated in FIG. 8, the emission control driver EDV may be disposed on the same side as that of the scan driver SDV, but the present disclosure is not limited thereto. For example, the emission control driver EDV may be disposed on a side different from that of the scan driver SDV. The emission control driver EDV may be mounted on the substrate SUB as a separate component, but the present disclosure is not limited thereto. For example, the emission control driver EDV may be directly formed on the substrate SUB, or may be located outside the substrate SUB and coupled to the pixels PXL through connectors.

In some embodiments, each of the pixels PXL may be formed of an active pixel. However, the types, structures, and/or driving schemes of the pixels PXL capable of being applied to the present disclosure are not particularly limited.

Figure 9A:
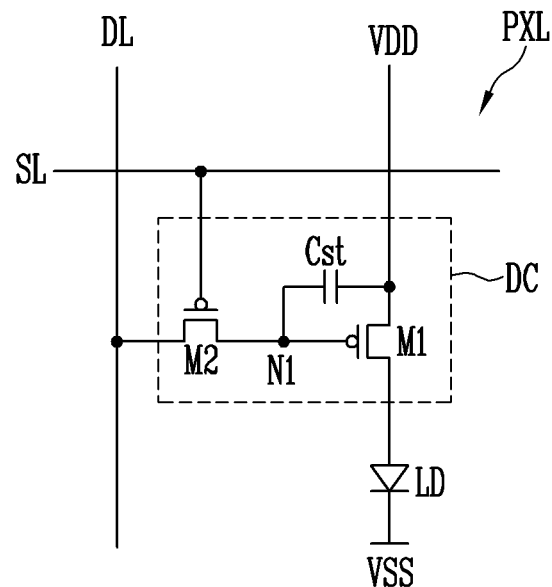
FIGS. 9A-9C each is a circuit diagram illustrating a pixel in accordance with one or more example embodiments of the present disclosure.
Figure 9B:
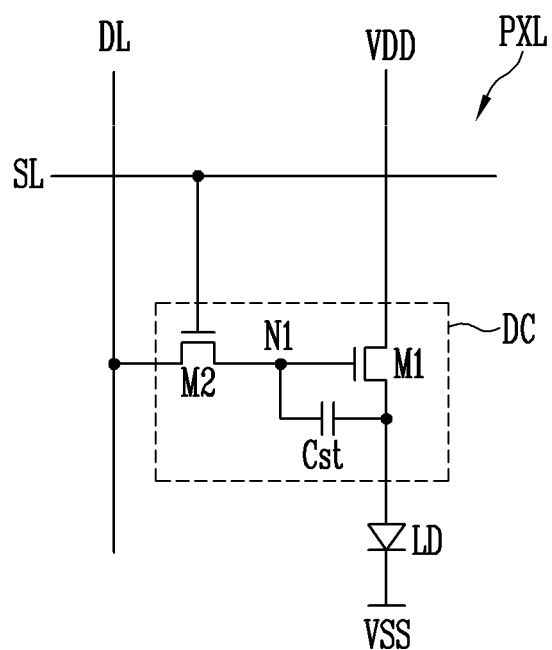
Figure 9C:
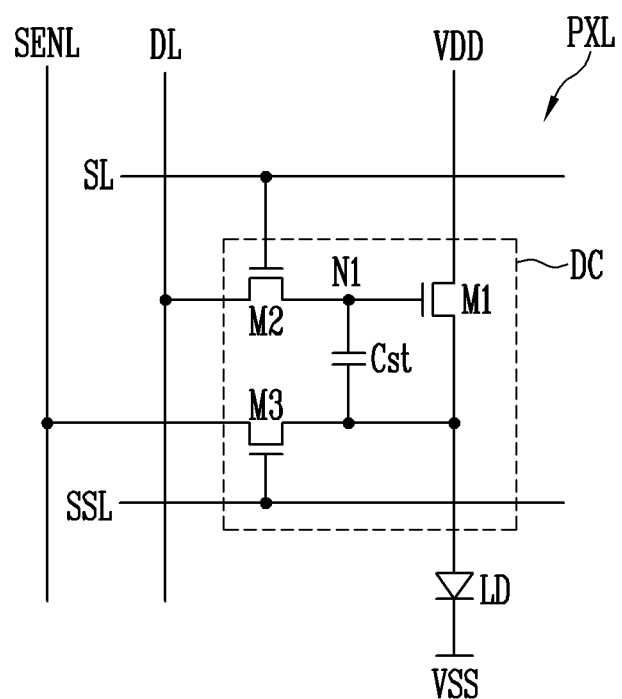

FIGS. 9A-9C are circuit diagrams illustrating pixels in accordance with respective embodiments. In some embodiments, FIGS. 9A-9C illustrate examples of a pixel that forms an active emission display panel.

Referring to FIGS. 1, 2, and 9A, each of the pixels PXL may include at least one light emitting element LD, and a driving circuit DC coupled to the light emitting element LD and configured to drive the light emitting element LD.

A first electrode (e.g., an anode electrode) of the light emitting element LD may be coupled to a first driving power supply VDD via the driving circuit DC. A second electrode (e.g., a cathode electrode) of the light emitting element LD may be coupled to a second driving power supply VSS. The light emitting element LD may emit light at a luminance corresponding to the amount of driving current which is controlled by the driving circuit DC.

Although FIG. 9A illustrates only one light emitting element LD, the present disclosure is not limited thereto. In some embodiments, one pixel PXL may include a plurality of light emitting elements LD. The plurality of light emitting elements LD included in the pixel PXL may be coupled in parallel and/or series to each other. In some embodiments, the pixel PXL may include one or more light emitting elements LD coupled in a reverse direction instead of or in addition to one or more light emitting elements LD coupled in a forward direction.

The first driving power supply VDD and the second driving power supply VSS may have different potentials. For example, the first driving power supply VDD may have a potential higher than that of the second driving power supply VSS by a value equal to or greater than a threshold voltage of the light emitting element LD. In other words, a voltage to be applied through the first driving power supply VDD may be greater than a voltage to be applied through the second driving power supply VSS.

In some embodiments of the present disclosure, the driving circuit DC may include a first transistor M1, a second transistor M2, and a storage capacitor Cst.

A first electrode of the first transistor (e.g., a driving transistor) M1 may be coupled to the first driving power supply VDD, and a second electrode thereof may be electrically coupled to a first electrode (e.g., an anode electrode) of the light emitting element LD. A gate electrode of the first transistor M1 may be coupled to the first node N1. The first transistor M1 may control the amount of driving current to be supplied to the light emitting elements LD in response to a voltage of the first node N1.

A first electrode of the second transistor (e.g., a switching transistor) M2 may be coupled to a data line DL, and a second electrode thereof may be coupled to a first node N1. Here, the first electrode and the second electrode of the second transistor M2 may be different electrodes. For example, if the first electrode is a source electrode, the second electrode is a drain electrode. A gate electrode of the second transistor M2 may be coupled to a scan line SL.

When a scan signal having a voltage (e.g., a gate-on voltage (e.g., a low level voltage)) capable of turning on the second transistor M2 is supplied from the scan line SL, the second transistor M2 is turned on to electrically couple the data line DL with the first node N1. Here, a data signal of a corresponding frame is supplied to the data line DL, whereby the data signal may be transmitted to the first node N1. The data signal transmitted to the first node N1 may be stored in the storage capacitor Cst. For example, the storage capacitor Cst may store a charge corresponding to the data signal from the data line DL transmitted to the first node N1.

One electrode of the storage capacitor Cst may be coupled to the first driving power supply VDD, and the other electrode thereof may be coupled to the first node N1. The storage capacitor Cst may be charged with a voltage (or store a charge) corresponding to a data signal supplied to the first node N1, and maintain the charged voltage until a data signal of a subsequent frame is supplied.

For the convenience of explanation, FIG. 9A illustrates the driving circuit DC having a relatively simple structure, including the second transistor M2 configured to transmit a data signal to the interior of each of the pixels PXL, the storage capacitor Cst configured to store the data signal, and the first transistor M1 configured to supply driving current corresponding to the data signal to the light emitting element LD.

However, the present disclosure is not limited thereto, and the structure of the pixel circuit DC may be changed in various ways. For example, the driving circuit DC may further include other circuit elements such as a compensation transistor configured to compensate for the threshold voltage of the first transistor M1, an initialization transistor configured to initialize the first node N1, and/or an emission control transistor configured to control an emission time of the light emitting element LD.

Furthermore, although FIG. 9A illustrates that the first transistor M1 and the second transistor M2 that are included in the driving circuit DC are formed of P-type transistors, the present disclosure is not limited to this. In other words, at least one of the first transistor M1 and the second transistor M2 included in the driving circuit DC may be changed to an N-type transistor.

For example, as illustrated in FIG. 9B, each of the first transistor M1 and the second transistor M2 of the driving circuit DC may be implemented as an N-type transistor. The configuration and operation of the driving circuit DC illustrated in FIG. 9B, other than a change in connection positions of some components (e.g., the storage capacitor Cst) due to a change in transistor type, may be similar to those of the driving circuit DC of FIG. 9A.

In some embodiments, referring to FIG. 9C, the pixel PXL may further include a third transistor (e.g., a sensing transistor) M3.

A gate electrode of the third transistor M3 may be coupled to a sensing signal line SSL. One electrode of the third transistor M3 may be coupled to a sensing line SENL, and the other electrode of the third transistor M3 may be coupled to the first electrode (e.g., the anode) of the light emitting element LD. The third transistor M3 may transmit a voltage value of the first electrode of the light emitting element LD to the sensing line SENL in response to a sensing signal supplied to the sensing signal line SSL during a sensing period. The voltage value transmitted through the sensing line SENL may be provided to an external circuit (e.g., a timing controller). The external circuit may extract information about characteristics of the pixels PXL (e.g., a threshold voltage of the first transistor M1, etc.) based on the provided voltage value. The extracted characteristic information may be used to convert image data to compensate for a deviation in characteristics of the pixel PXL.

Figure 10:
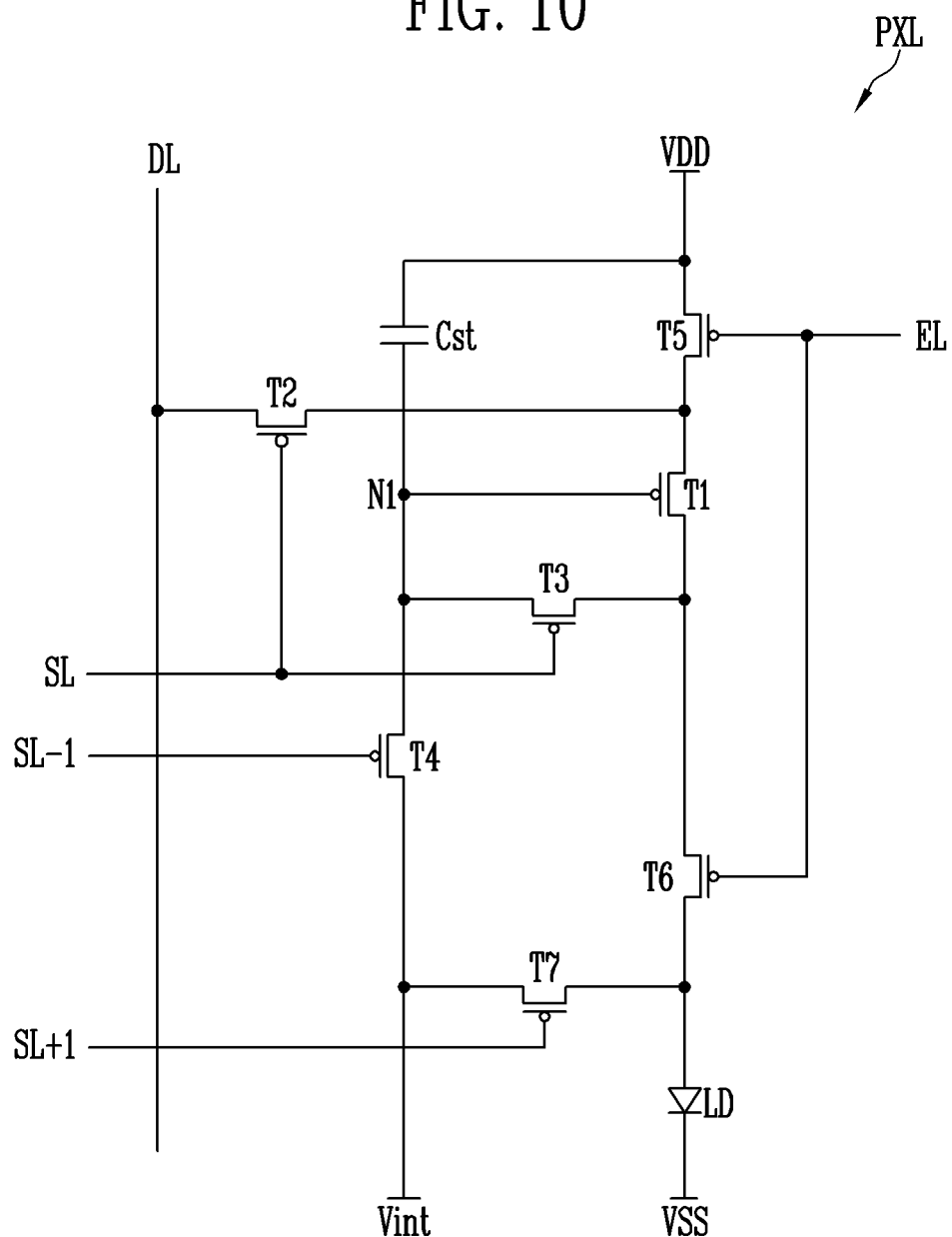
FIG. 10 is a circuit diagram illustrating a pixel in accordance with one or more example embodiments of the present disclosure.

FIG. 10 is a circuit diagram illustrating a pixel in accordance with one or more example embodiments of the present disclosure.

Referring to FIG. 10, a pixel PXL in accordance with one or more example embodiments of the present disclosure may include a light emitting device LD, first to seventh transistors T1, T2, T3, T4, T5, T6, and T7, and a storage capacitor Cst.

A first electrode (e.g., an anode) of the light emitting element LD may be coupled to the first transistor T1 via the sixth transistor T6. A second electrode (e.g., a cathode) of the light emitting element LD may be coupled to a second driving power supply VSS. The light emitting element LD may emit light having a luminance (e.g., a predetermined luminance) corresponding to the amount of driving current supplied from the first transistor T1.

A first electrode of the first transistor (e.g., a driving transistor) T1 may be coupled to the first driving power supply VDD via the fifth transistor T5, and a second electrode of the first transistor T1 may be coupled to a first electrode of the light emitting device LD via the sixth transistor T6. The first transistor T1 may control, in response to the voltage of the first node N1, that is a gate electrode thereof, the amount of current flowing from the first driving power supply VDD to the second driving power supply VSS via the light emitting element LD.

The second transistor (e.g., a switching transistor) T2 may be coupled between a data line DL and the first electrode of the first transistor T1. A gate electrode of the second transistor T2 may be coupled to a scan line SL. When a scan signal having a gate-on voltage (e.g., a low level voltage) is supplied to the scan line SL, the second transistor T2 may be turned on so that the data line DL may be electrically coupled with the first electrode of the first transistor T1.

The third transistor T3 may be coupled between the second electrode of the first transistor T1 and the first node N1. A gate electrode of the third transistor T3 may be coupled to a scan line SL. When a scan signal having a gate-on voltage (e.g., a low level voltage) is supplied from the scan line SL, the third transistor T3 may be turned on so that the second electrode of the first transistor T1 may be electrically coupled with the first node N1.

The fourth transistor T4 may be coupled between the first node N1 and an initialization power supply Vint. A gate electrode of the fourth transistor T4 may be coupled to a scan line SL−1 (e.g., a previous scan line). When a scan signal having a gate-on voltage is supplied to the scan line SL−1, the fourth transistor T4 is turned on so that the voltage of the initialization power supply Vint may be supplied to the first node N1. The initialization power supply Vint may be set to a voltage lower than that of a data signal.

The fifth transistor T5 may be coupled between the first driving power supply VDD and the first electrode of the first transistor T1. A gate electrode of the fifth transistor T5 may be coupled to the emission control line EL. The fifth transistor T5 may be turned on when an emission control signal having a gate-on voltage (e.g., a low level voltage) is supplied to the emission control line EL, and may be turned off in other cases.

The sixth transistor T6 is coupled between the second electrode of the first transistor T1 and the first electrode (e.g., an anode electrode) of the light emitting element LD. A gate electrode of the sixth transistor T6 may be coupled to the emission control line EL. The sixth transistor T6 may be turned on when an emission control signal having a gate-on voltage (e.g., a low level voltage) is supplied to the emission control line EL, and may be turned off in other cases.

The seventh transistor T7 may be coupled between the initialization power supply Vint and the first electrode (e.g., an anode electrode) of the light emitting element LD. A gate electrode of the seventh transistor T7 may be coupled to a scan line SL+1 (e.g., a next scan line). When a scan signal having a gate-on voltage (e.g., a low level voltage) is supplied to the scan line SL+1, the seventh transistor T7 may be turned on so that the voltage of the initialization power supply Vint may be supplied to the first electrode (e.g., an anode electrode) of light emitting element LD.

FIG. 10 illustrates the case where a gate electrode of the seventh transistor T7 is coupled to a scan line SL+1. However, the technical spirit of the present disclosure is not limited thereto. For example, in some embodiments of the present disclosure, the gate electrode of the seventh transistor T7 may be coupled to the scan line SL or the scan line SL−1. In this case, when a scan signal having a gate-on voltage is supplied to the scan line Si or the scan line SL−1, the voltage of the initialization power supply Vint may be supplied to the first electrode (e.g., an anode electrode) of the light emitting device LD via the seventh transistor T7.

The storage capacitor Cst may be coupled between the first driving power supply VDD and the first node N1. The storage capacitor Cst may store a voltage (or a charge) corresponding both to a data signal and to a threshold voltage of the first transistor T1.

Although in FIG. 10 the transistors, e.g., the first to seventh transistors T1, T2, T3, T4, T5, T6, and T7, included in the driving circuit DC have been illustrated as being formed of P-type transistors, the present disclosure is not limited to this. For example, at least one of the first to seventh transistors T1, T2, T3, T4, T5, T6, and T7 may be changed to an N-type transistor.

Figure 11:
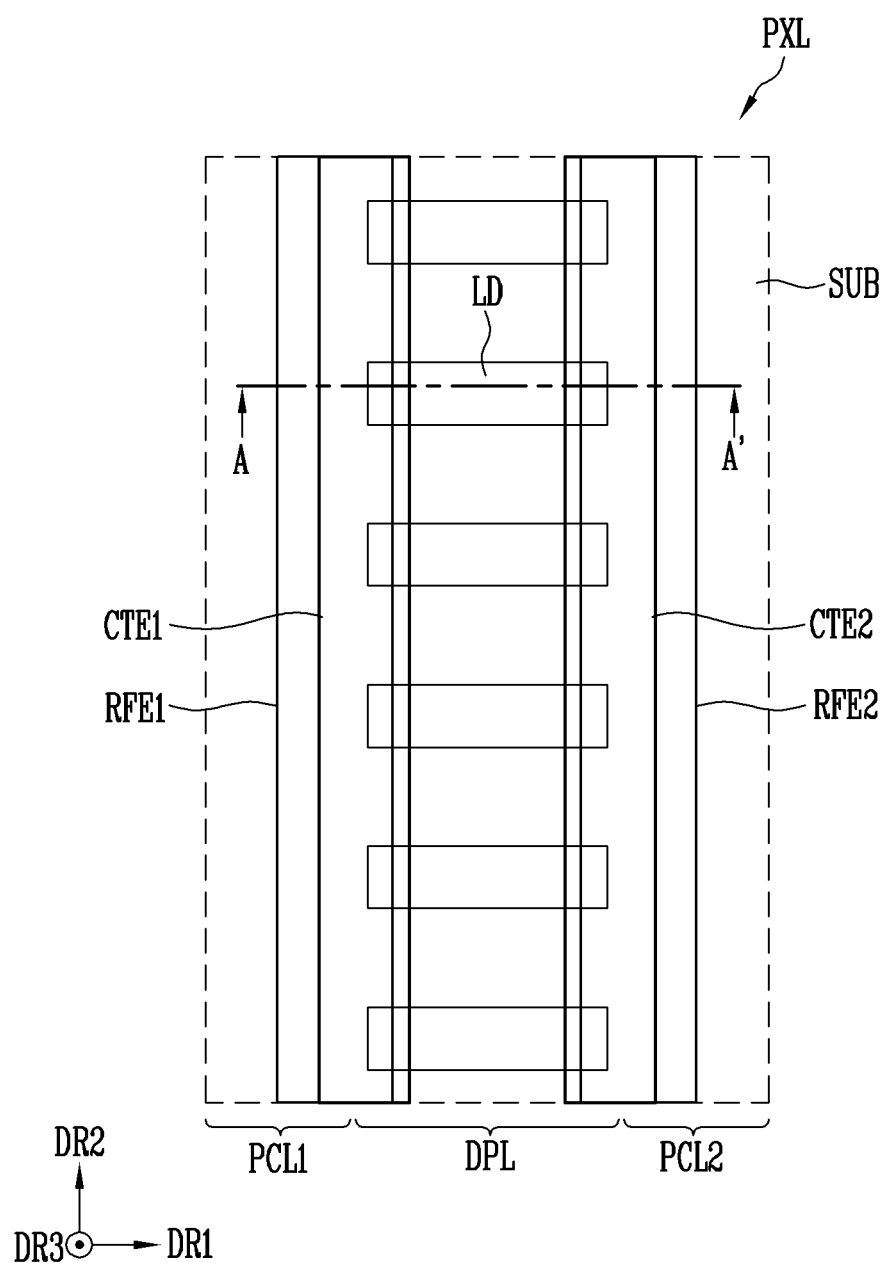
FIG. 11 is a plan view illustrating an example of a pixel included in the display device of FIG. 8.
Figure 12:
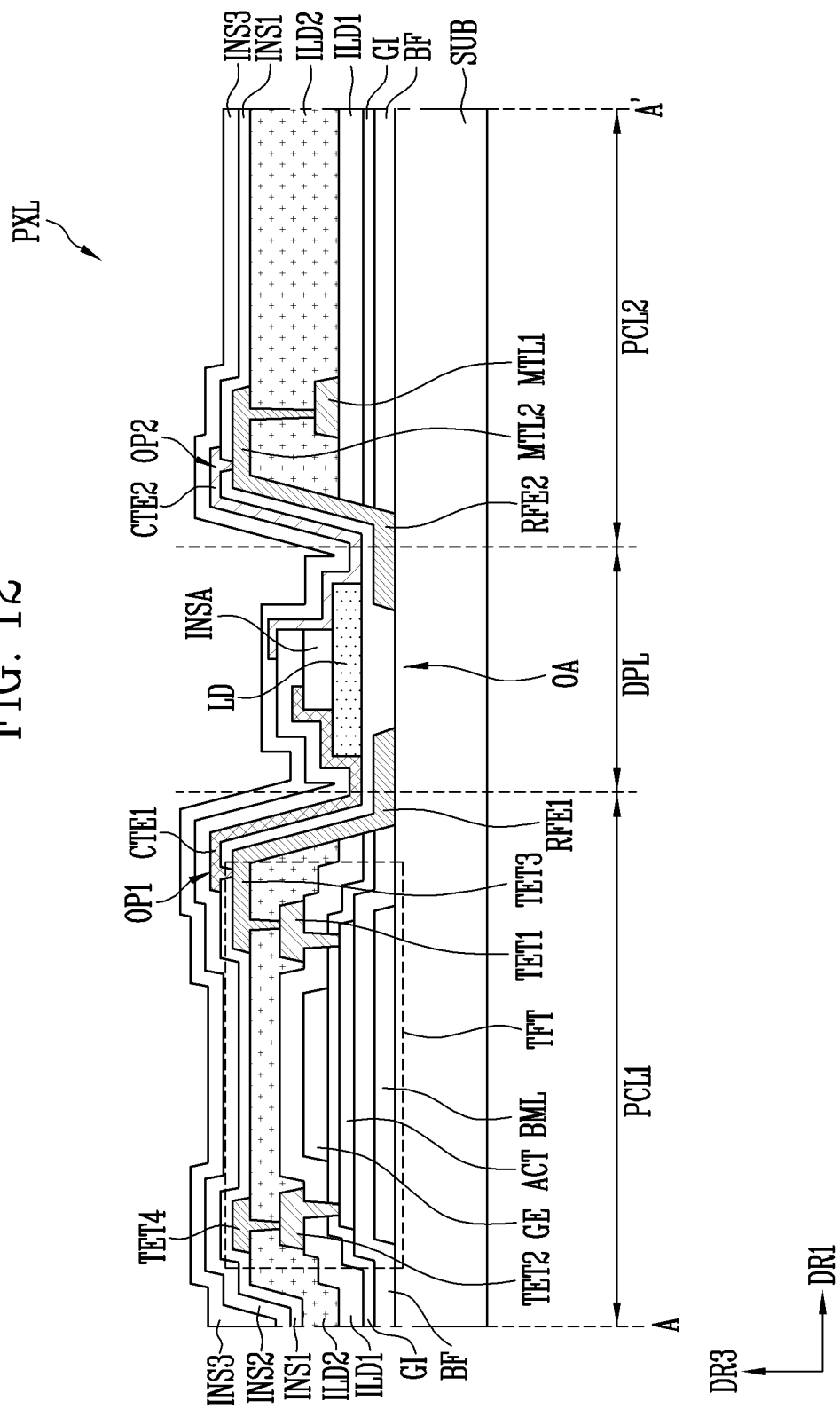
FIG. 12 is a sectional view illustrating the pixel, taken along the line A-A' of FIG. 11.

FIG. 11 is a plan view illustrating an example of a pixel included in the display device of FIG. 8. FIG. 12 is a sectional view illustrating the pixel, taken along the line A-A' of FIG. 11.

For the convenience of explanation, hereinafter, each electrode will be simplified and illustrated as being formed of a single electrode layer, but the present disclosure is not limited thereto. Each electrode may be formed of a plurality of electrode layers. In some embodiments of the present disclosure, the words "components are at (or formed and/or disposed at (or on)) the same layer" may mean that the components are formed through the same process and formed of the same material.

Although for the sake of explanation FIG. 11 illustrates that a plurality of light emitting elements LD are aligned in a first direction DR1, the alignment direction of the light emitting elements LD is not limited thereto. For example, some of the light emitting elements LD may be aligned in a direction diagonal to the first direction DR1.

Referring to FIGS. 11 and 12, a pixel PXL in accordance with some embodiments of the present disclosure may include a first circuit part PCL1, a second circuit part PCL2, and an emission part DPL which are disposed on the substrate SUB. In some embodiments, the first circuit part PCL1 and the second circuit part PCL2 may be disposed on the substrate SUB at positions space from each other in the first direction DR1. The emission part DPL may be disposed in space defined between the first circuit part PCL1 and the second circuit part PCL2. Hence, the first circuit part PCL1, the second circuit part PCL2, and the emission part DPL may be horizontally disposed along a second direction DR2 crossing the first direction DR1 on the substrate SUB.

The first circuit part PCL1 and the second circuit part PCL2 each may include a plurality of layers. For example, the first circuit part PCL1 and the second circuit part PCL2 each may include a buffer layer BF, a gate insulating layer GI, a first interlayer insulating layer ILD1, and a second interlayer insulating layer ILD2 which are successively disposed on the substrate SUB.

The first circuit part PCL1 and the second circuit part PCL2 may include a plurality of circuit elements constituting a driving circuit (e.g., the driving circuit DC of FIG. 9A) of the pixel PXL. For example, the first circuit part PCL1 may include a driving transistor TFT configured to provide a driving signal. The second circuit part PCL2 may include a first conductive line MTL1 and a second conductive line MTL2 which are configured to provide power supply signals. Here, the driving transistor TFT may be the first transistor M1 of FIG. 9A, but the present disclosure is not limited thereto.

The driving transistor TFT of the first circuit part PCL1 may include a bottom electrode layer BML, an active layer ACT, a gate electrode GE, a first transistor electrode TET1, a second transistor electrode TET2, a third transistor electrode TET3, and a fourth transistor electrode TET4.

The buffer layer BF may prevent impurities from being diffused into circuit elements included in the first circuit part PCL1 and the second circuit part PCL2. The buffer layer BF may be formed of a single layer or multiple layers. In the case where the buffer layer BF is formed of multiple layers, the respective layers may be formed of the same material or different materials. The buffer layer BF may be omitted depending on the material of the substrate SUB or processing conditions.

The bottom electrode layer BML may be formed between the substrate SUB and the buffer layer BF. The bottom electrode layer BML may include metal and overlap with at least a portion of the active layer ACT in a third direction DR3. The bottom electrode layer BML may be omitted depending on processing conditions.

The active layer ACT may be disposed between the buffer layer BF and the gate insulating layer GI. In the case where the pixel circuit layer PCL does not include the buffer layer BF, the active layer ACT may be disposed between the substrate SUB and the gate insulating layer GI. The active layer ACT may include a first area with which the first transistor electrode TET1 comes into contact, a second area to which the second transistor electrode TET2 is coupled, and a channel area disposed between the first and second areas. One of the first and second areas may be a source area, and the other may be a drain area.

The active layer ACT may be a semiconductor pattern formed of polysilicon, amorphous silicon, an oxide semiconductor, etc. The channel area of the active layer ACT may be an intrinsic semiconductor, which is an undoped semiconductor pattern. Each of the first and second areas of the active layer ACT may be a semiconductor pattern doped with an impurity (e.g., a predetermined impurity).

The gate electrode GE may be disposed between the gate insulating layer GI and the first interlayer insulating layer ILD1 and overlap with at least a portion of the active layer ACT. The gate electrode GE may be insulated from the active layer ACT by the gate insulating layer GI.

The first transistor electrode TET1 and the second transistor electrode TET2 may be disposed on the first interlayer insulating layer ILD1. The first transistor electrode TET1 and the second transistor electrode TET2 may be electrically coupled to the active layer ACT. For example, the first transistor electrode TET1 and the second transistor electrode TET2 may respectively come into contact with a first area and a second area of the active layer ACT through contact holes passing through the gate insulating layer GI and the first interlayer insulating layer ILD1.

In some embodiments, the first transistor electrode TET1 and the second transistor electrode TET2 may be concurrently formed (or simultaneously formed) through the same process.

The third transistor electrode TET3 and the fourth transistor electrode TET4 may be disposed on the second interlayer insulating layer ILD2. The third transistor electrode TET3 and the fourth transistor electrode TET4 may respectively come into contact with the first transistor electrode TET1 and the second transistor electrode TET2 through contact holes passing through the second interlayer insulating layer ILD2.

In other words, the third transistor electrode TET3 may be electrically coupled to the first area of the active layer ACT through the first transistor electrode TET1. The fourth transistor electrode TET4 may be coupled to the second area of the active layer ACT through the second transistor electrode TET2.

In some embodiments, the third transistor electrode TET3 and the fourth transistor electrode TET4 may be concurrently formed (e.g., simultaneously formed) through the same process.

Furthermore, the first circuit part PCL1 may include a first electrode RFE1 and a third electrode CTE1 which are coupled to the driving transistor TFT.

The first electrode RFE1 may be coupled to the third transistor electrode TET3. In some embodiments, the first electrode RFE1 may be integrally coupled with the third transistor electrode TET3. In other words, the first electrode RFE1 may be formed at the same layer as that of the third transistor electrode TET3 and formed concurrently (e.g., formed simultaneously) therewith. However, the present disclosure is not limited to the foregoing structure. In some embodiments, the first electrode RFE1 may be formed integrally with the first transistor electrode TET1 and/or the third transistor electrode TET3.

A first insulating layer INS1 may be disposed on the first electrode RFE1, the third transistor electrode TET3, and/or the fourth transistor electrode TET4. The first insulating layer INS1 may include a first opening OP1 through which a portion of the first electrode RFE1 is exposed. The third electrode CTE1 may be disposed on the first insulating layer INS1 and may be brought into contact with the first electrode RFE1 through the first opening OP1.

The second circuit part PCL2 may include a first conductive line MTL1 and a second conductive line MTL2.

The first conductive line MTL1 may be disposed between the first interlayer insulating layer ILD1 and the second interlayer insulating layer ILD2. The first conductive line MTL1 may be coupled to the driving power supply, e.g., the second driving power supply (VSS of FIG. 9A). In some embodiments, the first conductive line MTL1 may be concurrently formed (e.g., simultaneously formed) through the same process as that of the first transistor electrode TET1 and the second transistor electrode TET2 of the first circuit part PCL1.

The second conductive line MTL2 may be disposed on the second interlayer insulating layer ILD2. The second conductive line MTL2 may come into contact with the first conductive line MTL1 through a contact hole passing through the second interlayer insulating layer ILD2. In some embodiments, the second conductive line MTL2 may be concurrently formed (e.g., simultaneously formed) through the same process as that of the third transistor electrode TET3 and the fourth transistor electrode TET4 of the first circuit part PCL1.

Furthermore, the second circuit part PCL2 may include a second electrode RFE2 and a fourth electrode CTE2 which are coupled to the second conductive line MTL2.

The second electrode RFE2 may be formed integrally with the second conductive line MTL2. In other words, the second electrode RFE2 may be formed at the same layer as that of the second conductive line MTL2 and formed concurrently (or formed simultaneously) therewith. The first electrode RFE1 and the second electrode RFE2 may be concurrently formed (e.g., simultaneously formed) through the same process. In other words, the third transistor electrode TET3, the fourth transistor electrode TET4, the first electrode RFE1, the second conductive line MTL2, and the second electrode RFE2 may be formed at the same layer at the same time (e.g., concurrently or at substantially the same time). However, the present disclosure is not limited to the foregoing structure. In some embodiments, the second electrode RFE2 may be formed integrally with the first conductive line MTL1.

The first insulating layer INS1 may be disposed on the second electrode RFE2 and the second conductive line MTL2. The first insulating layer INS1 may include a second opening OP2 through which a portion of the second electrode RFE2 is exposed. The fourth electrode CTE2 may be disposed on the first insulating layer INS1 and may be brought into contact with the second electrode RFE2 through the second opening OP2.

The emission part DPL may include the first electrode RFE1, the second electrode RFE2, the first insulating layer INS1, a light emitting element LD, a fixing layer INSA, a third electrode CTE1, a fourth electrode CTE2, and a second insulating layer INS2.

The first electrode RFE1 of the first circuit part PCL1 and the second electrode RFE2 of the second circuit part PCL2 may extend toward the emission part DPL. The first electrode RFE1 and the second electrode RFE2 each may extend toward the emission part DPL along the side surfaces of the buffer layer BF, the gate insulating layer GI, the first interlayer insulating layer ILD1, and the second insulating layer ILD2. At least a portion of each of the first electrode RFE1 and the second electrode REF2 may come into contact with the substrate SUB.

By way of example, among the side surfaces of the buffer layer BF, the gate insulating layer GI, the first interlayer insulating layer ILD1, and the second interlayer insulating layer ILD2, side surfaces thereof disposed adjacent to the emission part DPL may be aligned with each other to form one side surface. The side surface may be inclined at an angle (e.g., a predetermined angle) with respect to the substrate SUB. The first electrode RFE1 and the second electrode RFE2 each may be disposed along the side surface with an overall uniform thickness and correspond to the shape of the side surface. The first electrode RFE1 and the second electrode RFE2 may extend in the second direction DR2, in a plan view.

The first electrode RFE1 and the second electrode RFE2 may be formed of conductive material. For example, the first electrode RFE1 and the second RFE2 may include metal such as Al, Mg, Ag, Pt, Pd, Au, Ni, Nd, Ir, Cr, Ti, or an alloy thereof. In some embodiments, the first electrode RFE1 and the second electrode RFE2 may include transparent conductive material such as indium tin oxide (ITO), indium zinc oxide (IZO), zinc oxide (ZnO), and indium tin zinc oxide (ITZO).

The material of the first electrode RFE1 and the second electrode RFE2 is not limited to the above-mentioned materials. For example, the first electrode RFE1 and the second electrode RFE2 may be made of a conductive material (e.g., a metal) having a suitable reflectivity (e.g., a predetermined reflectivity) as those with ordinary skill in the art would appreciate. In the case where the first electrode RFE1 and the second electrode RFE2 are made of conductive material (e.g., a metal) having a suitable reflectivity (e.g., a predetermined reflectivity) as those with ordinary skill in the art would appreciate, light emitted from opposite ends of a light emitting element LD, which will be explained below, may be reflected by the first electrode RFE1 and the second electrode RFE2 and then travel in a display direction (e.g., a third direction DR3).

As described above, the first electrode RFE1 and the second electrode RFE2 each may have a shape corresponding to the shape of the corresponding side surface formed by the buffer layer BF, the gate insulating layer GI, the first interlayer insulating layer ILD1, and the second interlayer insulating layer ILD2. Light emitted from a first end and a second end of the light emitting element LD may be reflected by the first electrode RFE1 and the second electrode RFE2 and thus more effectively travel in the third direction DR3. Consequently, the light output efficiency of the display device may be improved.

One of the first electrode RFE1 and the second electrode RFE2 may be an anode electrode, and the other one of the first electrode RFE1 and the second electrode RFE2 may be a cathode electrode. For example, the first electrode RFE1 may be an anode electrode, and the second electrode RFE2 may be a cathode electrode. However, the present disclosure is not limited to the foregoing case, and the opposite case is also possible.

The first electrode RFE1 and the second electrode RFE2 may provide a driving signal (or driving current) to the light emitting element LD in response to a scan signal and a data signal. The light emitting element LD may emit light having a luminance corresponding to the provided driving signal.

For example, referring also to FIG. 9A in addition to FIG. 12, the first electrode RFE1 and the second electrode RFE2 each may be electrically coupled with any one of the driving circuit DC and the second driving power supply VSS through a separate connection line or connection component. For example, the first electrode RFE1 may be electrically coupled with the driving circuit DC. The second electrode RFE2 may be electrically coupled with the second driving power supply VSS. Hence, the first electrode RFE1 and the second electrode RFE2 may provide a driving signal to the light emitting element LD.

The first insulating layer INS1 may be disposed on the first electrode RFE1 and the second electrode RFE2. The light emitting element LD may be disposed on the first insulating layer INS1.

As described above, the first insulating layer INS1 may be disposed on the second interlayer insulating layers ILD2 of the first circuit part PCL1 and the second circuit part PCL2. The first insulating layer INS1 may be provided on an overall surface of the substrate SUB and cover the third transistor electrode TET3, the fourth transistor electrode TET4, the second conductive line MTL2, the first electrode RFE1, and the second electrode RFE2, and may include a first opening OP1 that exposes a portion of the first electrode RFE1, and a second opening OP2 that exposes a portion of the second electrode RFE2. In some embodiments, the first insulating layer INS1 may be formed of an inorganic insulating layer formed of inorganic material, or an organic insulating layer formed of organic material.

In some embodiments, the first insulating layer INS1 may come into contact with the substrate SUB in an open area OA in which the substrate SUB is exposed between the first electrode RFE1 and the second electrode RFE2 that are spaced from each other in the emission part DPL.

The light emitting element LD may be disposed in a space defined between the first circuit part PCL1 and the second circuit part PCL2. In a plan view, the light emitting element LD may be disposed between the first electrode RFE1 and the second electrode RFE2.

The light emitting elements LD may be prepared in the form of being dispersed in a solution (e.g., a predetermined solution), and be supplied between the first circuit part PCL1 and the second circuit part PCL2 by an inkjet method, or the like. For example, the light emitting elements LD may be mixed with a volatile solvent and dropped onto the first insulating layer INS1 in the emission part DPL. The dropped light emitting elements LD may be self-aligned by an electric field formed between the first electrode RFE1 and the second RFE2 and disposed to have a uniform directionality. For example, the first ends of the light emitting elements LD may be disposed adjacent to the first electrode RFE1, and the second ends thereof may be disposed adjacent to the second electrode RFE2, so that the longitudinal direction of the light emitting elements LD may be parallel to the first direction DR1. The light emitting elements LD may be arranged along the second direction DR2.

The fixing layer INSA may be disposed on the light emitting elements LD to stably support and fix the light emitting elements LD on the first insulating layer INS1. In some embodiments, the fixing layer INSA may be an inorganic insulating layer including inorganic material. The fixing layer INSA may cover at least a portion of an outer peripheral surface (e.g., an outer circumferential surface) of each light emitting element LD and may be formed such that the first end and the second end of the light emitting element LD are exposed. Hence, the fixing layer INSA may prevent the light emitting elements LD from being removed from the substrate SUB. The fixing layer INSA may be omitted depending on processing conditions of the display device.

The third electrode CTE1 and the fourth electrode CTE2 may be disposed on the first insulating layer INS1 and the light emitting elements LD. The third electrode CTE1 of the first circuit part PCL1 and the fourth electrode CTE2 of the second circuit part PCL2 may extend toward the emission part DPL.

The third electrode CTE1 and the fourth electrode CTE2 each may come into contact with one end of the opposite ends of each of the light emitting elements LD. For example, the third electrode CTE1 may come into contact with the first end of the light emitting element LD, and the fourth electrode CTE2 may come into contact with the second end of the light emitting element LD.

In a plan view, the third electrode CTE1 may cover at least a portion of the first electrode RFE1 and may extend in the second direction DR2. The third electrode CTE1 may come into contact with the first electrode RFE1 through the first opening OP1 of the first insulating layer INS1. The third electrode CTE1 may electrically couple the first end (e.g., the second semiconductor layer (13 of FIG. 2)) of the light emitting element LD and the first electrode RFE1.

In a plan view, the fourth electrode CTE2 may cover at least a portion of the second electrode RFE2 and extend in the second direction DR2. The fourth electrode CTE2 may come into contact with the second electrode RFE2 through the second opening OP2 of the first insulating layer INS1. The fourth electrode CTE2 may electrically couple the second end (e.g., the first semiconductor layer 11 (of FIG. 2)) of the light emitting element LD and the second electrode RFE2.

The third electrode CTE1 and the fourth electrode CTE2 each may be formed of transparent conductive material. For example, the transparent conductive material may include ITO, IZO, ITZO, etc. In the case where the third electrode CTE1 and the fourth CTE2 are formed of transparent conductive material, light loss of light emitted from the light emitting element LD may be reduced when the light travels in the third direction DR3. However, the material of the third electrode CTE1 and the fourth electrode CTE2 is not limited to the above-mentioned materials.

In some embodiments, the second insulating layer INS2 may be disposed between the third electrode CTE1 and the fourth electrode CTE2. By way of example, the second insulating layer INS2 may include an inorganic insulating layer formed of inorganic material. The second insulating layer INS2 may be disposed to cover either the third electrode CTE1 or the fourth electrode CTE2. The other electrode may be disposed on the second insulating layer INS2. For example, the second insulating layer INS2 may be disposed on the first circuit part PCL1 and the emission part DPL and cover the third electrode CTE1. The fourth electrode CTE2 may be disposed on the second insulating layer INS2 in the emission part DPL. In other words, the third electrode CTE1 and the fourth electrode CTE2 may be electrically separated from each other by the second insulating layer INS2.

However, the disposition of the third electrode CTE1 and the fourth electrode CTE2 is not limited thereto. In some embodiments, the third electrode CTE1 and the fourth electrode CTE2 may be disposed at the same layer.

A third insulating layer INS3 may be disposed on overall areas of the first circuit part PCL1, the second circuit part PCL2, and the emission part DPL. The third insulating layer INS3 may also function as an encapsulation layer for preventing the third electrode CTE1, the fourth electrode CTE2, and the light emitting elements LD from being damaged during a process of manufacturing the display device, and preventing oxygen and/or water from penetrating thereinto.

The third insulating layer INS3 may be formed of an inorganic insulating layer including inorganic material. The third insulating layer INS3 may be formed of a single layer, but the present disclosure is not limited thereto. The third insulating layer INS3 may include a multi-layer structure. In the case where the third insulating layer INS3 includes a multi-layer structure, it may further include an organic insulating layer including organic material. The third insulating layer INS3 may include a multi-layer structure in which organic insulating layers and inorganic insulating layers are alternately disposed.

Although not illustrated, the display device 1000 may further include a bank layer disposed to enclose the pixels PXL. The bank layer may be a pixel definition layer configured to define an emission area. The bank layer may include at least one light shielding material and/or reflective material and thus prevent a light leakage phenomenon, in which light leaks between adjacent pixels, from occurring. Furthermore, the bank layer may prevent a solution including light emitting elements LD from leaking into an adjacent pixel during a process of aligning the light emitting elements LD. The bank layer may be omitted depending on processing conditions of the display device.

As described above, the display device 1000 may include the first circuit part PCL1, the second circuit part PCL2, and the emission part DPL.

The buffer layers BF, the gate insulating layers GI, the first interlayer insulating layers ILD1, and the second interlayer insulating layers ILD2 of the first circuit part PCL1 and the second circuit part PCL2 may form space for disposing light emitting elements LD in the emission part DPL. Furthermore, the first circuit part PCL1 and the second circuit part PCL2 may function as partition walls provided to reflect, in the third direction DR3, light emitted from the light emitting elements LD by the first electrode RFE1 and the second RFE2 disposed along the side surfaces of the layers. Hence, a separate partition wall for reflecting light emitted from the light emitting elements LD may be omitted, so that the manufacturing cost of the display device may be reduced.

Furthermore, because the third transistor electrode TET3 and the first electrode RFE1 of the first circuit part PCL1 are integrally formed and the second conductive line MTL2 and the second electrode RFE2 of the second circuit part PCL2 are integrally formed, a separate process of forming the first electrode RFE1 and the second electrode RFE2 may be omitted. Therefore, the manufacturing process of the display device may be simplified, and the manufacturing cost of the display device may be reduced.

Furthermore, because the first circuit part PCL1, the second circuit part PCL2, and the emission part DPL may be horizontally disposed (e.g., horizontally disposed with respect to the substrate SUB), a thin film display device may be provided.

Hereinafter, embodiments of the display device will be described. In the following embodiments, like reference numerals are used to designate the same components as those of the above-mentioned embodiments, and descriptions thereof will be omitted or simplified and focused on differences therefrom.

Figure 13:
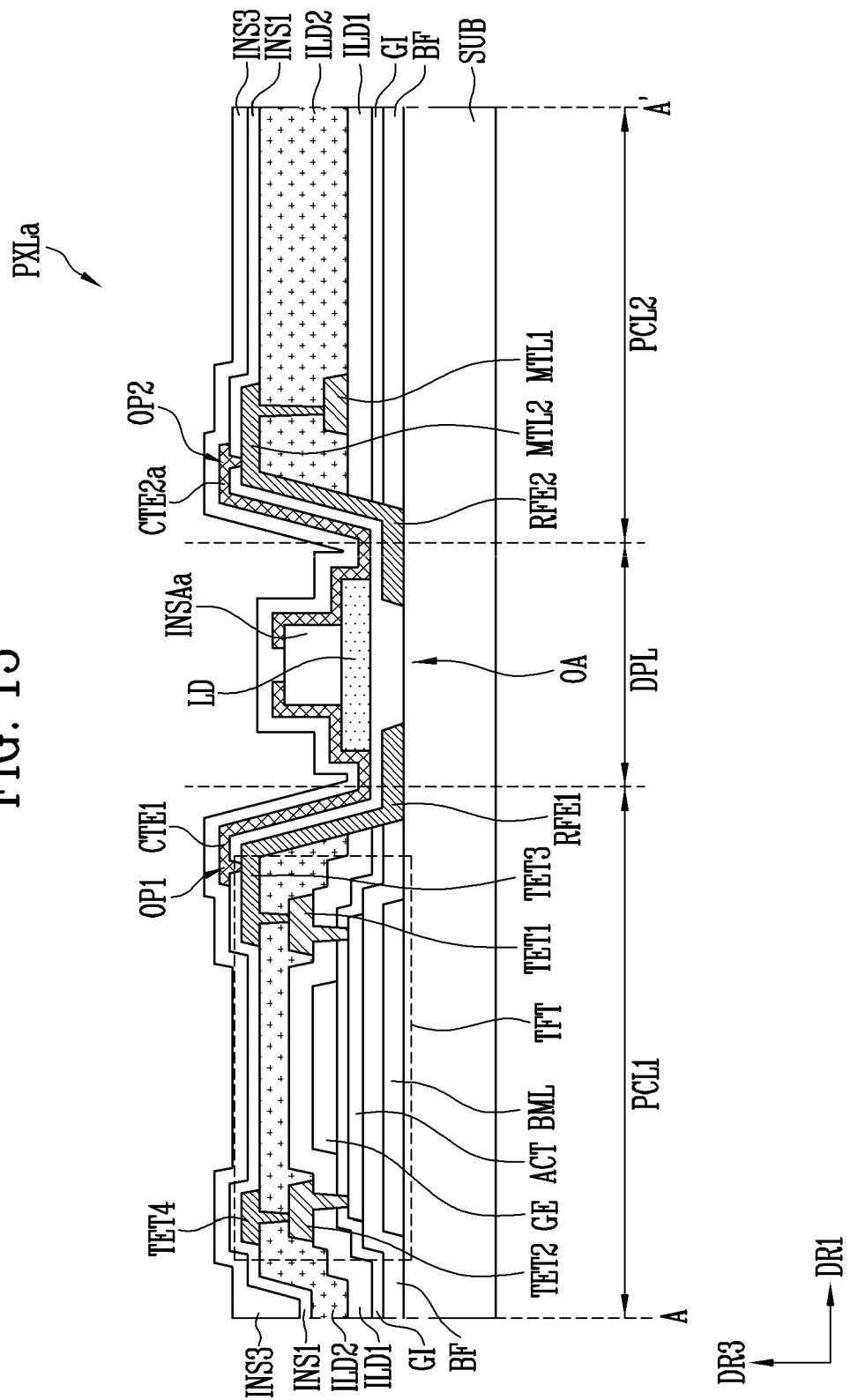
FIGS. 13-15 are sectional views of respective pixels included in display devices in accordance with various embodiments, and sectional diagrams corresponding to the line A-A' of FIG. 11.
Figure 14:
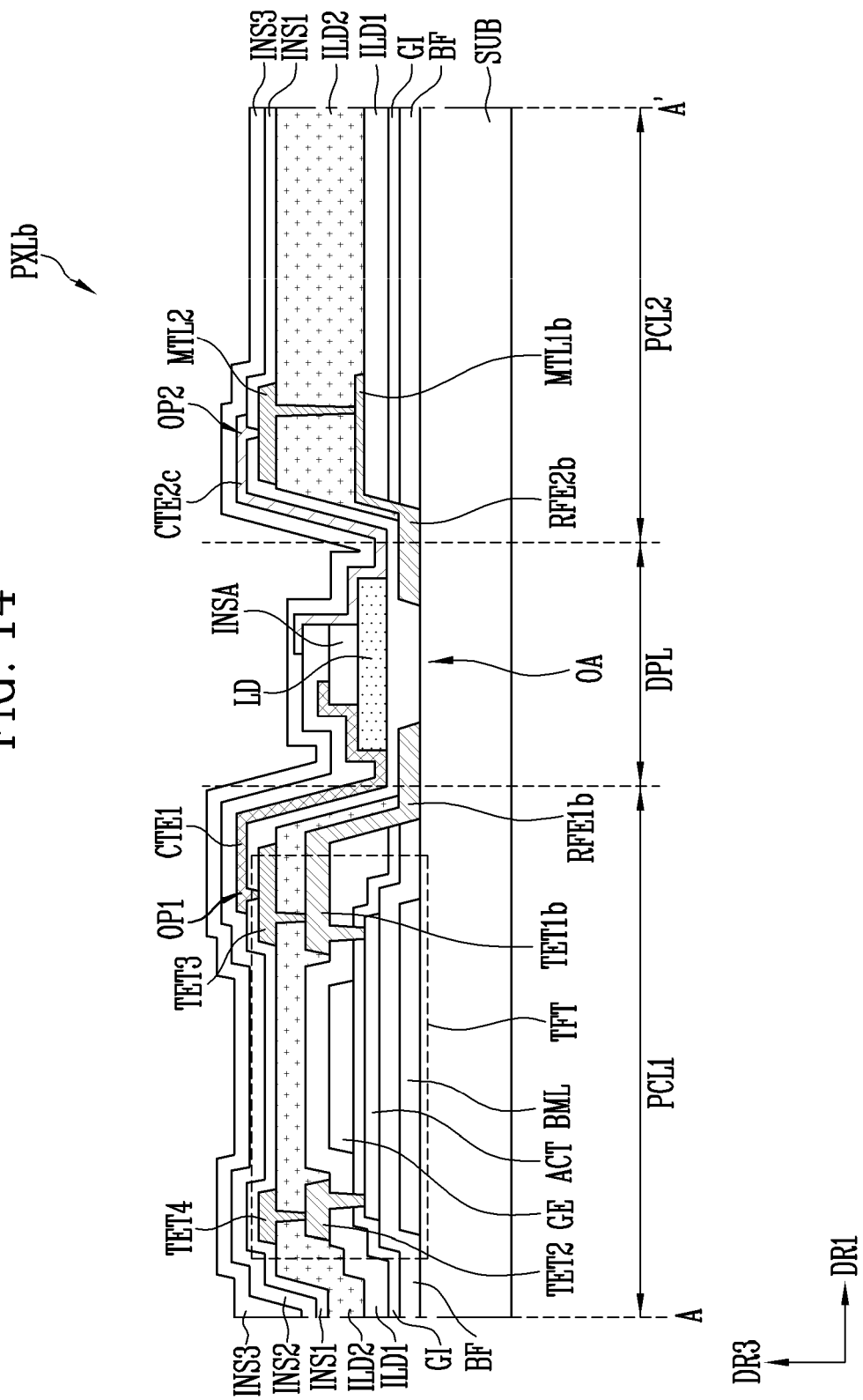
Figure 15:
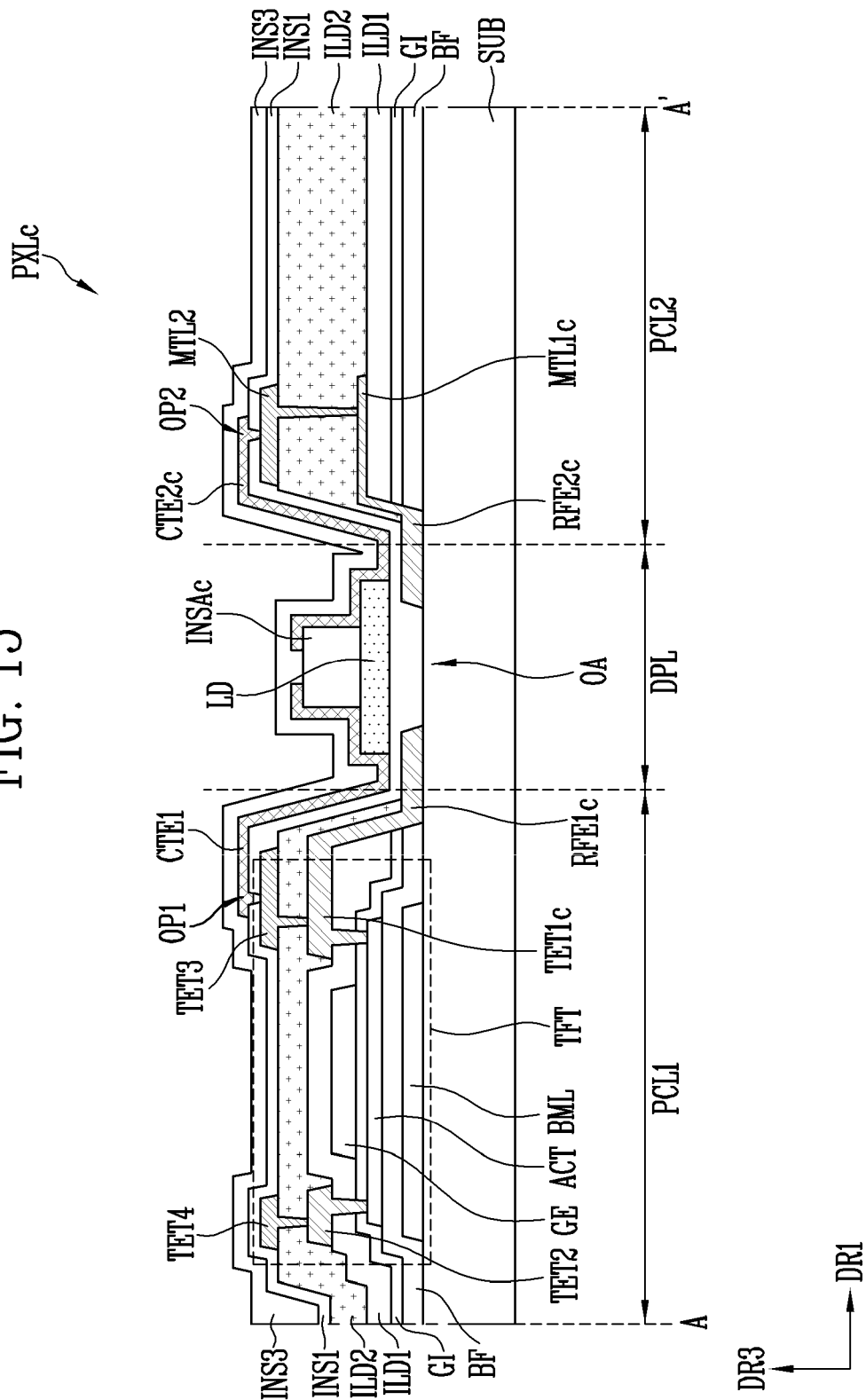

FIGS. 13-15 are sectional views of respective pixels included in display devices in accordance with various embodiments, and sectional diagrams corresponding to the line A-A' of FIG. 11.

The example embodiment of FIG. 13 differs from the example embodiment of FIG. 12 in that a pixel PXLa includes a fourth electrode CTE2a disposed at the same layer as that of the third electrode CTE1 and formed concurrently (e.g., formed simultaneously) with the third electrode CTE1.

Referring to FIG. 13, the fourth electrode CTE2a of the second circuit part PCL2 may come into contact with the second electrode RFE2 through the second opening OP2 of the first insulating layer INS1. The fourth electrode CTE2a may be disposed at the same layer as that of the third electrode CTE1 and formed concurrently (e.g., formed simultaneously) therewith through the same process. The fourth electrode CTE2a may extend to the emission part DPL along the surface of the first insulating layer INS1 and come into contact with the second ends of the light emitting elements LD.

As described above, in the case where the third electrode CTE1 and the fourth electrode CTE2a are concurrently formed (e.g., simultaneously formed), the second insulating layer (INS2 of FIG. 12) for electrically separating the third electrode CTE1 from the fourth electrode CTE2a may be omitted, and the manufacturing process of the display device may be simplified, and the manufacturing cost of the display device may be reduced.

In the present embodiment, a fixing layer INSAa may be an organic insulating layer including organic material, unlike that of the fixing layer INSA of FIG. 12. The thickness of the fixing layer INSAa may be greater than the thickness of the fixing layer INSA of FIG. 12. Hence, the fixing layer INSAa may prevent a short circuit from occurring between the third electrode CTE1 and the fourth electrode CTE2a during a process of concurrently forming (e.g., simultaneously forming) the third electrode CTE1 and the fourth electrode CTE2a, and may stably fix the light emitting elements LD in correct positions.

An embodiment of FIG. 14 differs from the embodiment of FIG. 12 in that a pixel PXLb includes a first electrode RFE1b formed integrally with the first transistor electrode TET1, and a second electrode RFE2b formed integrally with a first conductive line MTL1b.

Referring to FIG. 14, the first electrode RFE1b of the first circuit part PCL1 may be formed integrally with the first transistor TET1b. The second electrode RFE2b of the second circuit part PCL2 may be formed integrally with the first conductive line MTL1b. As described above, the first transistor electrode TET1b and the first conductive line MTL1b may be disposed at the same layer and formed at the same time (or substantially same time) through the same process, and the first electrode RFE1b and the second electrode RFE2b that are formed integrally therewith may also be formed at the same time through the same process.

In some embodiments, the third transistor electrode TET3, the fourth transistor electrode TET4, the second conductive line MTL2, and the second interlayer insulating layer ILD2 may be omitted. In this case, the third electrode CTE1 may come into contact with the first transistor electrode TET1b (or the first electrode RFE1b) through the first opening OP1 of the first insulating layer INS1, and the fourth electrode CTE2c may come into contact with the first conductive line MTL1b (or the second electrode RFE2b) through the second opening OP2 of the first insulating layer INS1.

An example embodiment of FIG. 15 differs from the example embodiment of FIG. 14 in that a pixel PXLc includes a fourth electrode CTE2c disposed at the same layer as that of the third electrode CTE1 and formed concurrently (e.g., formed simultaneously) with the third electrode CTE1.

Referring to FIG. 15, a first electrode RFE1c of the first circuit part PCL1 may be formed integrally with a first transistor electrode TET1c. A second electrode RFE2c of the second circuit part PCL2 may be formed integrally with a first conductive line MTL1c.

The fourth electrode CTE2c of the second circuit part PCL2 may be disposed at the same layer as that of the third electrode CTE1 and formed concurrently (e.g., formed simultaneously) therewith through the same process. The fourth electrode CTE2c may extend to the emission part DPL along the surface of the first insulating layer INS1 and come into contact with the second ends of the light emitting elements LD.

As described above with reference to FIG. 13, in the case where the third electrode CTE1 and the fourth electrode CTE2c are concurrently formed (e.g., simultaneously formed), the second insulating layer (INS2 of FIG. 12) for electrically separating the third electrode CTE1 from the fourth electrode CTE2c may be omitted, the manufacturing process of the display device may be simplified, and the manufacturing cost of the display device may be reduced.

In the present embodiment, a fixing layer INSAc may be an organic insulating layer including organic material, unlike that of the fixing layer INSA of FIG. 12. The thickness of the fixing layer INSAc may be greater than the thickness of the fixing layer INSA of FIG. 12.

Figure 16:
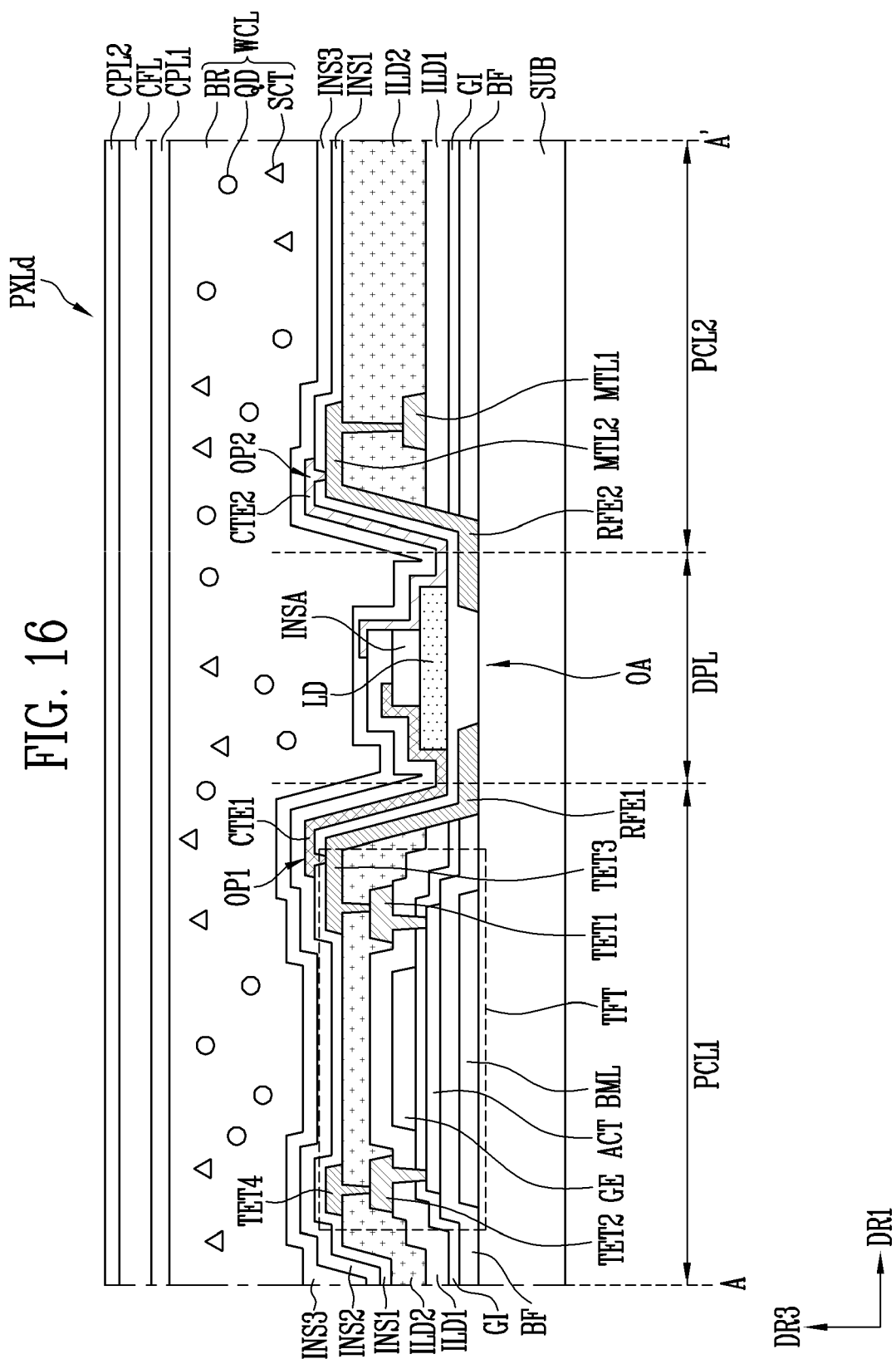
FIG. 16 is a sectional view of a pixel included in a display device in accordance with some embodiments, and a sectional diagram corresponding to the line A-A' of FIG. 11.

FIG. 16 is a sectional view of a pixel included in a display device in accordance with one or more example embodiments of the present disclosure, and a sectional diagram corresponding to the line A-A' of FIG. 11. An example embodiment of FIG. 16 differs from the example embodiment of FIG. 12 in that a pixel PXLd further includes a wavelength conversion layer WCL and a color filter layer CFL, and the other components thereof is substantially equal or similar to those of the embodiment of FIG. 12.

Referring to FIG. 16, the pixel PXLd may further include the wavelength conversion layer WCL and the color filter layer CFL.

The wavelength conversion layer WCL may be disposed on the third insulating layer INS3. The wavelength conversion layer WCL may include a base layer BR, and wavelength conversion particles QD and scattering particles SCT which are dispersed in the base layer BR.

The base layer BR is not particularly limited, so long as it is formed of material having high light transmissivity and excellent dispersion characteristics for the wavelength conversion particles QD and the scattering particles SCT. For example, the base layer BR may include organic material such as epoxy resin, acrylic resin, cardo resin, or imide resin.

The wavelength conversion particles QD may convert a peak wavelength of incident light to a different specific peak wavelength. In other words, the wavelength conversion particles QD may convert the color of the incident light to a different color.

For example, in the case where the light emitting element LD emits blue light, the wavelength conversion particles QD may convert the blue light provided from the light emitting elements LD to different color light and emit the different color light from the pixel PXL. For example, the wavelength conversion particles QD may convert the blue light provided from the light emitting elements LD to red light or green light and emit the red or green light from the pixel PXL.

Examples of the wavelength conversion particles QD may include quantum dots, quantum rods, or fluorescent substances. A quantum dot may be particle material which emits light having a specific wavelength while an electron makes a transition from the conduction band to the valence band. Hereinafter, the wavelength conversion particles QD will be described as being quantum dots, but the present disclosure is not limited thereto.

The quantum dot may be semiconductor nanocrystal material. The quantum dot may have a specific bandgap depending on the composition and the size thereof, and thus absorb incident light and then emit light having an intrinsic wavelength. Examples of a semiconductor nanocrystal of quantum dot may include a group IV nanocrystal, a group II-VI compound nanocrystal, a group III-V compound nanocrystal, a group IV-VI nanocrystal, and a combination thereof.

For instance, examples of the group IV nanocrystal may include silicon (Si), germanium (Ge), and a binary compound such as silicon carbide (SiC) and silicon-germanium (SiGe), but the present disclosure is not limited thereto.

Examples of the Group II-VI compound nanocrystal may include binary compounds such as CdSe, CdTe, ZnS, ZnSe, ZnTe, ZnO, HgS, HgSe, HgTe, MgSe, MgS, and a mixture thereof, ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and quanternary compounds such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. However, the present disclosure is not limited thereto.

Examples of the Group III-V compound nanocrystal may include binary compounds such as GaN, GaP, GaAs, GaSb, AlN, AlP, AlAs, AlSb, InN, InP, InAs, InSb, and a mixture thereof, ternary compounds such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and quanternary compounds such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. However, the present disclosure is not limited thereto.

Examples of the Group IV-VI nanocrystal may include binary compounds such as SnS, SnSe, SnTe, PbS, PbSe, PbTe, and a mixture thereof, ternary compounds such as SnSeS, SnSeTe, SnSTe, PbSeS, PbSeTe, PbSTe, SnPbS, SnPbSe, SnPbTe, and a mixture thereof, and quanternary compounds such as SnPbSSe, SnPbSeTe, SnPbSTe, and a mixture thereof. However, the present disclosure is not limited thereto.

The quantum dot may have any shape which is generally used in the art, and is not particularly limited. For example, a spherical, pyramid-shaped, multi-arm shaped, or cuboid nanoparticle, nanotube, nanowire, nanofiber, and nanoplate particle may be used. The binary compound, the ternary compound, or the quaternary compound may be present in particles at a substantially uniform concentration, or may be present in the same particles with different concentration distributions.

The quantum dot may have a core-shell structure including a core having the above-mentioned nanocrystal, and a shell which encloses the core. An interface between the core and the shell may have a concentration gradient in which the concentration of elements that are present in the shell decreases in a direction from the surface of the particle to the center of the particle. The shell of the quantum dot may function as a protective layer for preventing the core from chemically changing so that semiconductor characteristics may be retained, and/or may function as a charging layer for assigning electrophoresis characteristics to the quantum dot. The shell may have a single-layer structure or a multi-layer structure. Examples of the shell of the quantum dot may include metallic or nonmetallic oxide, a semiconductor compound, or a combination thereof.

For instance, although examples of metallic or nonmetallic oxide may include binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or ternary compounds such as $MgAl_2O_4$, $CoFe_2O_4$, $NiFe_2O_4$, and $CoMn_2O_4$, the present disclosure is not limited thereto.

Furthermore, although examples of the semiconductor compound may include CdS, CdSe, CdTe, ZnS, ZnSe, ZnTe, ZnSeS, GaAs, GaP, GaSb, HgS, HgSe, HgTe, InAs, InP, InSb, AlAs, AlP, and AlSb, the present disclosure is not limited thereto.

Light emitted from the above-mentioned quantum dot may have a full width at half maximum (FWHM) of an emission wavelength spectrum that is approximately 45 nm or less. Thereby, the purity and the reproducibility of a color expressed by the display device may be improved. Furthermore, light emitted from the quantum dot may be emitted in various directions regardless of a direction of incident light. Therefore, the side visibility of the display device may be improved.

The scattering particles SCT may have a refractive index different from that of the wavelength conversion layer WCL and form an optical interface along with the base layer BR. The material of the scattering particles SCT is not particularly limited, so long as it may scatter at least some of transmitted light. For example, the scattering particles SCT may be particles formed of material such as titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or silica.

The scattering particles SCT may scatter light in random directions regardless of a direction of incident light without substantially converting the wavelength of light passing through the base layer BR. Therefore, the side visibility of the display device may be improved.

A first capping layer CPL1 may be disposed on the wavelength conversion layer WCL. The first capping layer CPL1 may be an inorganic insulating layer formed of inorganic material. The first capping layer CPL1 may function as an encapsulation layer that covers an overall surface of the wavelength conversion layer WCL and thus prevent oxygen and/or water from penetrating into the wavelength conversion layer WCL from the outside. Hence, the wavelength conversion layer WCL may be encapsulated by the third insulating layer INS3 and the first capping layer CPL1.

The color filter layer CFL may be disposed on the first capping layer CPL1. The color filter layer CFL may be an absorption filter configured to allow light having a specific color to pass therethrough, and absorb light of other colors and block the travel of the light of other colors.

A second capping layer CPL2 may be disposed on the color filter layer CFL. The second capping layer CPL2 may be an inorganic insulating layer formed of inorganic material. The second capping layer CPL2 may function as an encapsulation layer which covers an overall surface of the color filter layer CFL and thus prevent oxygen and/or water from penetrating into the color filter layer CFL from the outside. Hence, the color filter layer CFL may be encapsulated by the first capping layer CPL1 and the second capping layer CPL2.

In some embodiments, at least one of the wavelength conversion layer WCL, the first capping layer CPL1, and the second capping layer CPL2 may be omitted.

In the embodiment of FIG. 16, there is illustrated the structure in which the wavelength conversion layer WCL and the color filter layer CFL are directly formed on the substrate SUB, but the present disclosure is not limited thereto. In some embodiments, the wavelength conversion layer WCL and the color filter layer CFL may be formed on a separate substrate different from the substrate SUB on which the light emitting elements LD are disposed. In this case, the substrate on which the wavelength conversion layer WCL and the color filter layer CFL are formed may face the substrate SUB on which the light emitting elements LD are disposed.

In a display device according to example embodiments of the present disclosure, a circuit layer and an emission part are horizontally disposed on a substrate, so that a manufacturing process may be simplified, and a thin display device may be produced.

In a display device according to example embodiments of the present disclosure, during a process of forming the circuit layer and the emission part on the substrate, some components of the circuit layer and the emission part may be concurrently formed (or simultaneously formed) during the same process, so that the cost required to manufacture the display device can be reduced.

The effects of the present disclosure are not limited by the foregoing, and other various effects are anticipated herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display device comprising:
   a substrate;
   a first circuit part and a second circuit part on the substrate and spaced from each other in a first direction;
   an emission part between the first circuit part and the second circuit part, the emission part being located between the first circuit part and the second circuit part in a direction parallel to the substrate; and
   a first insulation layer between the substrate and the emission part,
   wherein the first circuit part comprises a first electrode extending to the emission part, and a third electrode on the first electrode,
   wherein the second circuit part comprises a second electrode extending to the emission part, and a fourth electrode on the second electrode,
   wherein the emission part comprises a light emitting element located between the first electrode and the second electrode, at least a portion of the third electrode being in contact with a first end of the light emitting element and at least a portion of the fourth electrode being in contact with a second end of the light emitting element,
   wherein the first insulating layer continuously covers the first and second electrodes from a location below the light emitting element to a portion of the first and second electrodes farthest away from the substrate, respectively,
   wherein the display device further comprises a wavelength conversion layer on the light emitting element,
   wherein the wavelength conversion layer comprises a wavelength conversion particle and a scattering particle, and
   wherein the wavelength conversion particle comprises a quantum dot.

2. The display device according to claim 1,
   wherein the first insulating layer comprises a first opening and a second opening, wherein a portion of the first electrode is exposed through the first opening, and a portion of the second electrode is exposed through the second opening,
   wherein the third electrode contacts with the first electrode through the first opening, and
   wherein the fourth electrode contacts with the second electrode through the second opening.

3. The display device according to claim 1, further comprising a second insulating layer, wherein at least a portion of the second insulating layer is on the third electrode and at least another portion of the second insulating layer is on the light emitting element, and
   wherein the fourth electrode is on the second insulating layer.

4. The display device according to claim 1, wherein each of the third electrode and the fourth electrode comprises a transparent conductive oxide.

5. The display device according to claim 1,
   wherein the first circuit part comprises a driving transistor between the substrate and the first electrode and electrically coupled with the light emitting element,
   wherein the driving transistor comprises:
   an active layer on the substrate;
   a gate electrode on the active layer; and
   a first transistor electrode and a second transistor electrode located above the gate electrode and in contact with the active layer.

6. The display device according to claim 5, further comprising a third transistor electrode on the first transistor electrode and electrically coupled with the first transistor electrode through a contact hole,
   wherein the first electrode is integrally formed with the third transistor electrode.

7. The display device according to claim 5, further comprising a third transistor electrode on the first transistor electrode and electrically coupled with the first transistor electrode through a contact hole,
   wherein the first electrode is integrally formed with the first transistor electrode.

8. The display device according to claim 5, wherein the driving transistor further comprises a bottom electrode layer between the substrate and the active layer.

9. The display device according to claim 1, wherein the first insulating layer contacts with the substrate and the light emitting element.

10. The display device according to claim 1, wherein the first electrode and the second electrode each includes a metal having a predetermined reflectivity.

11. A display device comprising:
    a substrate;
    a first circuit part and a second circuit part on the substrate and spaced from each other in a first direction;
    an emission part between the first circuit part and the second circuit part, the emission part being located between the first circuit part and the second circuit part in a direction parallel to the substrate; and
    a first insulating layer,
    wherein the first circuit part comprises a first electrode extending to the emission part, and a third electrode on the first electrode, wherein the second circuit part comprises a second electrode extending to the emission part, and a fourth electrode on the second electrode, wherein the third electrode and the fourth electrode are at a same layer, wherein the emission part comprises a light emitting element located between the first electrode and the second electrode, at least a portion of the third electrode being in contact with a first end of the light emitting element and at least a portion of the fourth electrode being in contact with a second end of the light emitting element, wherein at least a portion of the first insulating layer is on the first electrode and at least another portion of the first insulating layer is on the second electrode, wherein the first insulating layer is between the substrate and the light emitting element, wherein a fixing layer of the display device encloses at least a portion of an outer peripheral surface of the light emitting element and exposes the first end and the second end of the light emitting element, wherein the fixing layer is located between the light emitting element and the third electrode, wherein the first circuit part comprises a driving transistor between the substrate and the first electrode and electrically coupled with the light emitting element, wherein the driving transistor comprises:

an active layer on the substrate;

a gate electrode on the active layer; and a first transistor electrode and a second transistor electrode located above the gate electrode and in contact with the active layer, and a bottom electrode layer between the substrate and the active layer.

12. A display device comprising:

a substrate;

a first electrode and a second electrode on the substrate, the first electrode and the second electrode being at a same layer and spaced from each other;

a first insulating layer on the first electrode and the second electrode;

a light emitting element on the first insulating layer and located between the first electrode and the second electrode;

a third electrode electrically coupling the first electrode and a first end of the light emitting element; and a fourth electrode electrically coupling the second electrode and a second end of the light emitting element; and a driving transistor located between the substrate and the first electrode and electrically coupled with the light emitting element, wherein the first insulating layer is between the substrate and the light emitting element and in contact with the substrate exposed between the first electrode and the second electrode, wherein the first insulating layer continuously covers the first and second electrodes from a location below the light emitting element to a portion of the first and second electrodes farthest away from the substrate, respectively, wherein the driving transistor comprises:

an active layer on the substrate;

a gate electrode on the active layer; and a first transistor electrode and a second transistor electrode located above the gate electrode and in contact with the active layer, wherein the display device further comprises a third transistor electrode on the first transistor electrode and electrically coupled with the first transistor electrode through a contact hole, and wherein the first electrode is integrally formed with one of the first transistor electrode or the third transistor electrode.

13. The display device according to claim 12, wherein the first insulating layer comprises a first opening and a second opening, wherein a portion of the first electrode is exposed through the first opening, a portion of the second electrode is exposed through the second opening, wherein the third electrode contacts with the first electrode through the first opening, and wherein the fourth electrode contacts with the second electrode through the second opening.

14. The display device according to claim 12, further comprising a second insulating layer on the third electrode, wherein the fourth electrode is on the second insulating layer.

* * * * *